US012681236B2

(12) United States Patent
Dernaika et al.

(10) Patent No.: US 12,681,236 B2
(45) Date of Patent: Jul. 14, 2026

(54) COUPON WAFER AND METHOD OF PREPARATION THEREOF

(71) Applicant: ROCKLEY PHOTONICS LIMITED, Altrincham (GB)

(72) Inventors: Mohamad Dernaika, Cork (IE); Frank Peters, Cork (IE); Guomin Yu, Glendora, CA (US)

(73) Assignee: Rockley Photonics Limited, Altrincham (GB)

( * ) Notice: Subject to any disclaimer, the term of this patent is extended or adjusted under 35 U.S.C. 154(b) by 806 days.

(21) Appl. No.: 17/911,111

(22) PCT Filed: Mar. 16, 2021

(86) PCT No.: PCT/EP2021/056709
§ 371 (c)(1),
(2) Date: Sep. 12, 2022

(87) PCT Pub. No.: WO2021/185850
PCT Pub. Date: Sep. 23, 2021

(65) Prior Publication Data
US 2023/0117282 A1     Apr. 20, 2023
US 2024/0241317 A9     Jul. 18, 2024

Related U.S. Application Data

(60) Provisional application No. 63/105,775, filed on Oct. 26, 2020, provisional application No. 62/990,779, filed on Mar. 17, 2020.

(30) Foreign Application Priority Data

Dec. 15, 2020     (GB) ..................................... 2019776

(51) Int. Cl.
*G02B 6/136*     (2006.01)
*B41F 16/00*     (2006.01)
(Continued)

(52) U.S. Cl.
CPC .......... *G02B 6/136* (2013.01); *B41F 16/0046* (2013.01); *G02B 6/12* (2013.01);
(Continued)

(58) Field of Classification Search
CPC .......... G02B 6/136; G02B 6/12; G02B 6/122; G02B 6/132; G02B 6/4207; G02B 6/43;
(Continued)

(56) References Cited

U.S. PATENT DOCUMENTS 5,678,301 A * 10/1997 Gochnour ......... H01L 23/49838
324/762.04
2015/0371874 A1* 12/2015 Bower .................. H01L 21/561
257/798

(Continued)

OTHER PUBLICATIONS

Buehler, K. et al., "Micro-Transfer-Printing and Potential Process Optimizations by FEA", 2019 20th International Conference on Thermal, Mechanical and Multi-Physics Simulation and Experiments in Microelectronics and Microsystems (EuroSim E), 2019, 8 pages, IEEE.

(Continued)

*Primary Examiner* — Eliseo Ramos Feliciano
*Assistant Examiner* — Thaddeus J Kolb
(74) *Attorney, Agent, or Firm* — Womble Bond Dickinson (US) LLP

(57)     ABSTRACT

A coupon wafer comprising a device coupon (110) for use in a micro-transfer printing process used to fabricate an opto-electronic device. The coupon wafer includes a wafer substrate (124), and the device coupon (110) is attached to the wafer substrate via a tether (122) and the tether (122) is formed from a dielectric material.

5 Claims, 26 Drawing Sheets

(51) Int. Cl.

| | |
|---|---|
| *G02B 6/12* | (2006.01) |
| *G02B 6/122* | (2006.01) |
| *G02B 6/132* | (2006.01) |
| *G02B 6/42* | (2006.01) |
| *G02B 6/43* | (2006.01) |
| *H10D 84/05* | (2025.01) |
| *H10P 72/70* | (2026.01) |
| *H10P 95/00* | (2026.01) |
| *H10W 72/00* | (2026.01) |
| *H10W 74/01* | (2026.01) |

(52) U.S. Cl.
CPC ............. *G02B 6/122* (2013.01); *G02B 6/132* (2013.01); *G02B 6/4207* (2013.01); *G02B 6/43* (2013.01); *H10D 84/05* (2025.01); *H10P 72/74* (2026.01); *H10P 95/112* (2026.01); *H10W 72/0198* (2026.01); *H10W 74/014* (2026.01); *H10P 72/7428* (2026.01)

(58) Field of Classification Search
CPC .... G02B 6/00; G02B 6/42; G02B 6/13; B41F 16/0046; H01L 21/561; H01L 21/6835; H01L 21/7813; H01L 24/97; H01L 2221/68354; H01L 2224/95001; H01L 21/7806; H01L 25/00; H01L 2221/68318; H01L 2221/6835; H01L 2221/68368; H01L 2221/68381; H01L 21/78; H10D 84/05; H10H 20/018; H10H 20/01; H10F 55/00
See application file for complete search history.

(56) References Cited

U.S. PATENT DOCUMENTS

| | | | | |
|---|---|---|---|---|
| 2019/0051552 A1* | 2/2019 | Bower | ............... | H01L 21/6835 |
| 2019/0305179 A1* | 10/2019 | Roelkens | ........... | H01L 21/6835 |
| 2019/0385885 A1* | 12/2019 | Trindade | ............ | H01L 21/6835 |
| 2020/0381600 A1* | 12/2020 | Liu | ................... | H10H 20/8316 |

OTHER PUBLICATIONS

International Search Report and Written Opinion of the International Searching Authority, mailed Jun. 22, 2021, corresponding to PCT/EP2021/056709, 21 pages.
U.K. Intellectual Property Office Search and Examination Report, dated May 26, 2021, for Patent Application No. GB2019776.0, 5 pages.
U.K. Intellectual Property Office Examination Report, dated Oct. 31, 2022, for Patent Application No. GB2019776.0, 3 pages.
U.K. Intellectual Property Office Examination Report, dated Sep. 13, 2023, for Patent Application No. GB2019776.0, 3 pages.
Zhang, Jing et al., "Transfer-printing-based integration of a III-V-on-silicon distributed feedback laser", Optics Express, Apr. 2, 2018, pp. 8821-8830, vol. 26, No. 7, Optical Society of America.
Zhang, Jing et al., "Transfer-printing-based integration of a III-V-on-silicon distributed feedback laser", Optics Express, 2017, 12 pages, Optical Society of America.
International Search Report for PCT/EP2021/056709 filed Mar. 16, 2021, 5 pages.

\* cited by examiner

COUPON WAFER AND METHOD OF PREPARATION THEREOF

RELATED APPLICATIONS

This application is a U.S. National Phase Patent Application of International Application Number PCT/EP2021/056709, filed on 2021 Mar. 16, which claims (i) priority to, and the benefit of, U.S. Patent Application No. 62/990,779 filed 17 Mar. 2020 and (ii) priority to GB Patent Application No. 2019776.0 filed 15 Dec. 2020; the contents of all of the applications identified in this paragraph are incorporated herein by reference in their entirety.

FIELD OF THE INVENTION

The present invention relates to a coupon wafer, a method of preparing a coupon wafer, a method of micro-transfer printing, and an optoelectronic device.

BACKGROUND

Hybrid integration of III-V semiconductor based electro-optical devices (e.g. lasers, modulators, and amplifiers), with silicon-on-insulator (SOI) platforms confers the advantage of combining the best parts of both materials systems.

However, convention chip bonding processes typically use flip-chip bonding, in which the III-V semiconductor based device is inverted and bonded into a cavity on the SOI platform. The manufacturing process can be costly and have a low yield, because of the metal bumping requirements for the die bonding and difficulties in accurately controlling the alignment of the respective components.

Micro-transfer printing (MTP) is therefore being investigated as an alternative way to integrate III-V semiconductor based devices within an SOI wafer. In these methods, the III-V semiconductor based device is fabricated on a device wafer. It can then be picked up using a stamp (typically formed of elastomer) and printed into a cavity on the SOI wafer in the same orientation in which it was manufactured and without the need for metal bumping. The alignment between the III-V semiconductor based device and the waveguides in the SOI platform are thereby predetermined in the vertical direction (z direction). The requirements for alignment are therefore reduced from three dimensions to two, which can be more easily facilitated.

There is a desire to improve the MTP process, specifically to improve the volume and yield so as to render the process commercially viable.

SUMMARY

Accordingly, in a first aspect, embodiments of the invention provide a coupon wafer comprising a device coupon for use in a micro-transfer printing process used to fabricate an optoelectronic device, wherein the coupon wafer includes a wafer substrate, and the device coupon is attached to the wafer substrate via tether; and wherein the tether comprises a dielectric material.

Tethers formed from a dielectric material can be more consistently applied than tethers formed from photoresist, providing improved yields when undertaking micro-transfer printing. Notably, forming the tether from a dielectric is a simple process than which can help ensure that no tether residue remains during printing.

The coupon wafer may have any one or, to the extent that they are compatible, any combination of the following optional features.

The device coupon may be a III-V semiconductor based device coupon, e.g. one which contains one or more III-V semiconductor layers. The coupon wafer may be a III-V coupon wafer, e.g. one formed partially or completely from III-V semiconductors. The tether may be formed at least partially from a dielectric material, or is formed entirely of a dielectric material.

By dielectric material, it is meant an electrical insulator which can be polarized by an applied electric field. For example, the dielectric material may be silicon nitride, silicon dioxide, or other materials which can be grown through plasma-enhanced chemical vapour deposition or sputtering.

The tether may extend across a surface of the device coupon and across a portion of an upper surface of the wafer substrate. By upper surface, it may be one located closest to the device coupon. Such tethers can advantageously alter the breaking mechanics when the device coupon is lifted from the coupon wafer.

The tether may be a multi-layered tether. The tether may include a layer of silicon nitride or a layer of silicon oxide. The tether may include: a layer of silicon nitride and a layer of photoresist; a layer of silicon oxide and a layer of photoresist; or a layer of silicon nitride, a layer of silicon oxide, and a layer of photoresist.

The tether may have a thickness of at least 20 nm and no more than 10 μm, no more than 500 nm, or no more than 50 nm.

The device coupon may include an anti-reflective coating, and the tether may be at least partially provided by the anti-reflective coating.

The coupon wafer may further comprise a sacrificial layer, located between the device coupon and the wafer substrate. The tether may extend down a sidewall of the device coupon, across a portion of an upper surface of the sacrificial layer, down a sidewall of the sacrificial layer, and across a portion of an upper surface of the wafer substrate. The sacrificial layer may be wider than the device coupon.

The coupon wafer may further comprise a gap, between the device coupon and the wafer substrate. The tether may extend down a sidewall of the device coupon, above a portion of an upper surface of the wafer substrate, and down to contact the wafer substrate.

The tether may comprise a first region which extends down a vertical side of the device coupon towards the wafer substrate, and a second region which extends horizontally away from the device coupon.

By horizontally, it may be meant in a direction across the plane of the wafer substrate. By vertically, it may be meant a direction perpendicular to the plane of the wafer substrate.

The coupon may comprise a raised platform above which the device coupon is located, wherein the tether extends beyond the raised platform and along a sidewall thereof.

The coupon wafer may comprise:

a channel, being bounded on one side by a surface of the device coupon, and on an opposite side by a sidewall of the coupon wafer; and the tether may extend across a surface of the device coupon, and across the channel to contact one or more sidewalls of the coupon wafer.

The tether may extend vertically down the one or more sidewalls of the coupon wafer, and/or across an upper surface of the coupon wafer.

A portion of the tether extending across the channel may be narrower than an adjacent portion of the tether. Accordingly, the tether may preferentially break at this point.

The channel may extend around the entire perimeter of the device coupon.

The coupon wafer may include a plurality of tethers.

The or each tether may include one or more apertures therethrough. The aperture may expose a portion of a release layer, such that subsequent etching of the release layer is more efficient.

In a second aspect, embodiments of the invention provide a method of preparing a coupon wafer for use in a micro-transfer printing process, the coupon wafer comprising a device coupon used to fabricate an optoelectronic device, wherein the method comprises:

depositing a tether across a surface of the device coupon to attach the device coupon to a wafer substrate of the coupon wafer;

wherein the tether is formed of a dielectric material.

The method may further comprise:

a filling step, performed before depositing the tether, of at least partially filling a channel with a filling material, the channel being bounded on one side by a surface of the device coupon and on an opposite side by a sidewall of the coupon wafer, and an etching step, performed after depositing the tether, of removing the filling material, leaving a gap between the device coupon and one or more sidewalls of the coupon wafer.

The method may comprise a step, performed before the filling step, of etching the channel into the coupon wafer, the step of etching the channel at least partially defining the device coupon. The coupon wafer may be a multi-layered coupon wafer, wherein layers separated from the wafer substrate by the release layer at least partially form the device coupon. The method may include a step, performed after etching the channel but before the filling step, of depositing an anti-reflective coating over exposed surfaces of the coupon wafer. The method may include a subsequent step, performed after depositing the anti-reflective coating, of etching away a part of the anti-reflective coating not located around the device coupon.

The method may further comprise a step of etching away a sacrificial layer, the sacrificial layer being located between the device coupon and the wafer substrate.

The filling step may only partially fill the channel, with a gap being left between the filling material and the one or more sidewalls of the coupon wafer. The gap may be filled with tether.

In a third aspect, embodiments of the present invention provide a method of micro-transfer printing, using the coupon wafer of the first aspect, the method comprising steps of:

adhering the device coupon to a stamp, and lifting it away from the coupon wafer; and depositing the device coupon on a platform wafer, thereby forming an optoelectronic device.

The method may comprise a step, performed before adhering the device coupon to a stamp, of etching away a release layer located between the device coupon and a wafer substrate of the coupon wafer.

In a fourth aspect, embodiments of the present invention provide an optoelectronic device formed using the method of the third aspect.

The invention includes the combination of the aspects and preferred features described except where such a combination is clearly impermissible or expressly avoided.

Further aspects of the present invention provide: a computer program comprising code which, when run on a computer, causes the computer to perform the method of the second and third aspect; a computer readable medium storing a computer program comprising code which, when run on a computer, causes the computer to perform the method of the second and third aspect; and a computer system programmed to perform the method of the second and third aspect.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Aspects and embodiments of the present invention will now be discussed with reference to the accompanying figures. Further aspects and embodiments will be apparent to those skilled in the art.

Figure 1A:
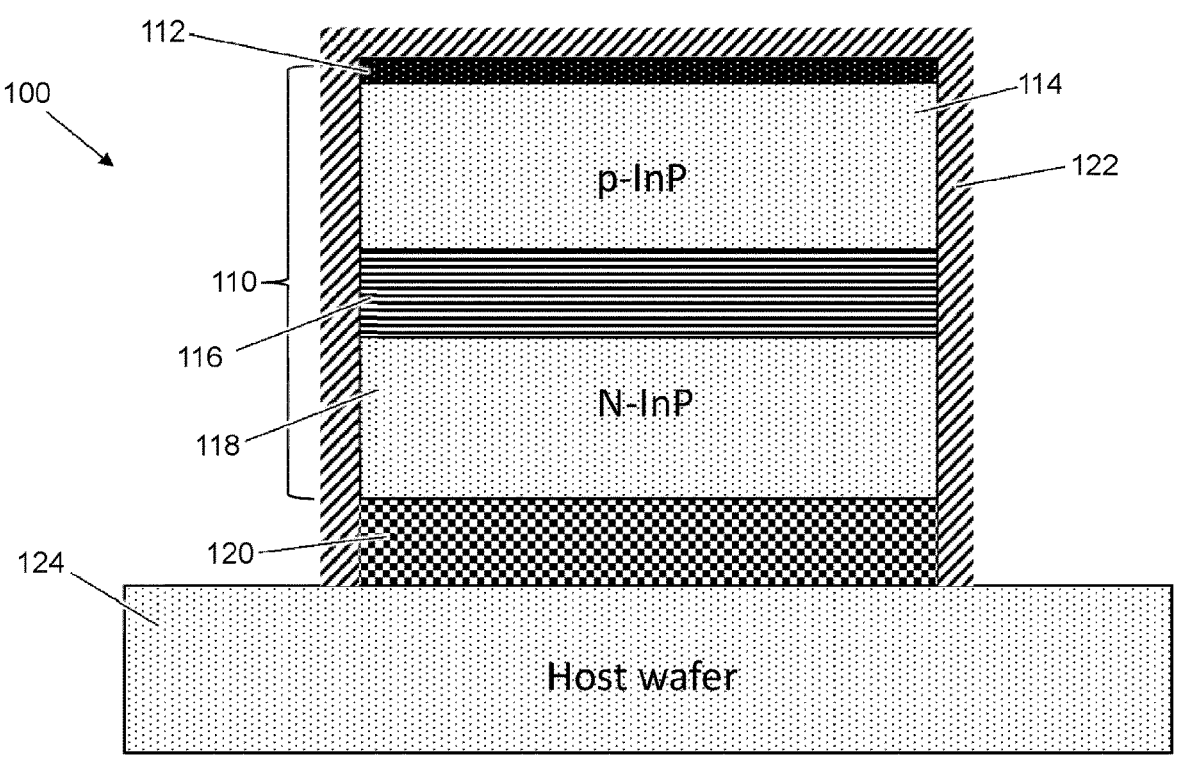
FIG. 1A shows a cross-sectional view of a coupon wafer.
Figure 1B:
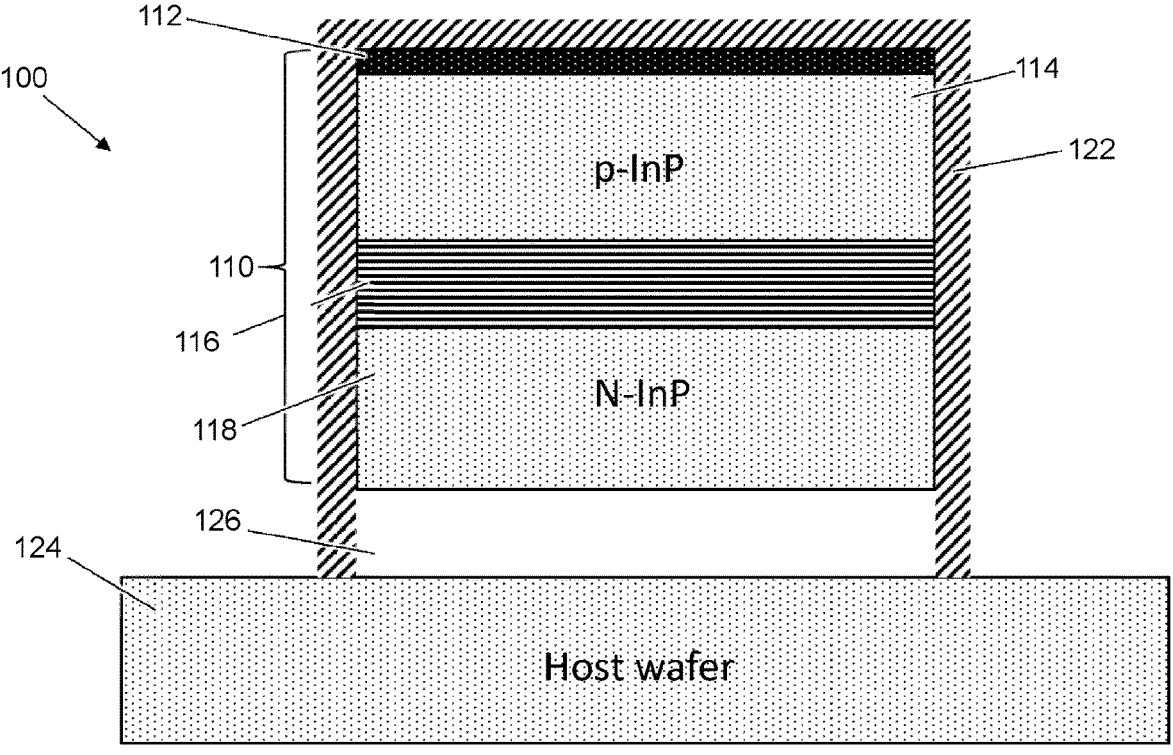
FIG. 1B shows the coupon wafer of FIG. 1A after a release layer has been removed.

FIG. 1A shows a cross-sectional view of a coupon wafer 100. The coupon wafer 100 includes a device coupon 110, which is formed of a plurality of layers. In this example, the device coupon includes: a contact layer or layers 112; a P doped indium phosphide layer 114, a quaternary active layer 116, and an n doped indium phosphide layer 118. The device coupon 110 is encapsulated on at least some, and in some examples a majority if not all, sides by dielectric tether 122. The device coupon 110 is separated from a wafer substrate 124 of the coupon wafer 100 by a release layer 120. FIG. 1B shows the coupon wafer of FIG. 1A after a release layer has been removed, and so a gap 126 exists between the device coupon 110 and the wafer substrate 124. In this example, the tether 122 is the only element connecting the device coupon 110 to the wafer substrate 124. The wafer substrate may be, for example, made from indium phosphide. The tether in this example extends across an uppermost surface of the device coupon (i.e. a surface distalmost from the substrate) and down the sidewalls of the device coupon towards the substrate.

Figure 2A:
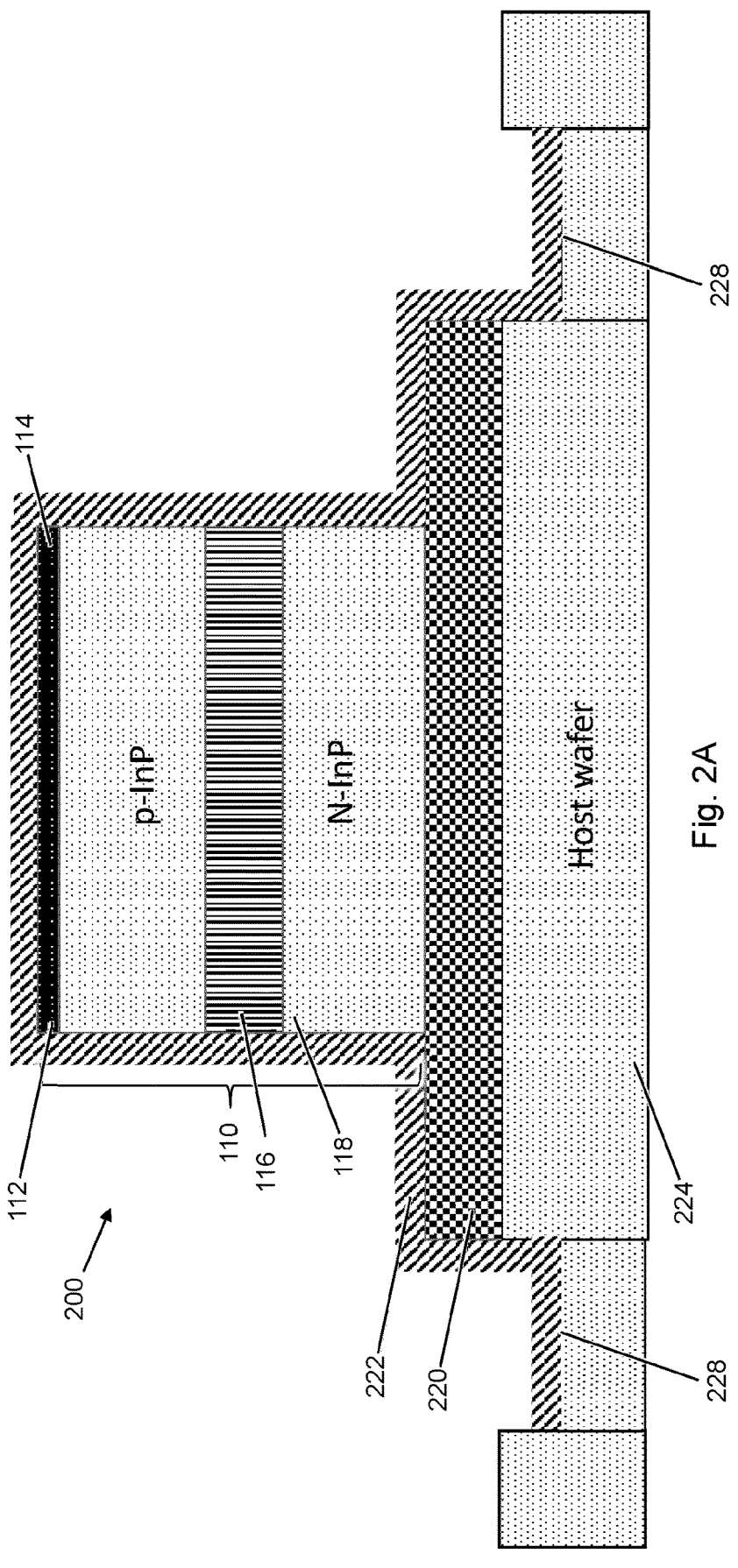
FIG. 2A shows a cross-sectional view of a variant coupon wafer.
Figure 2B:
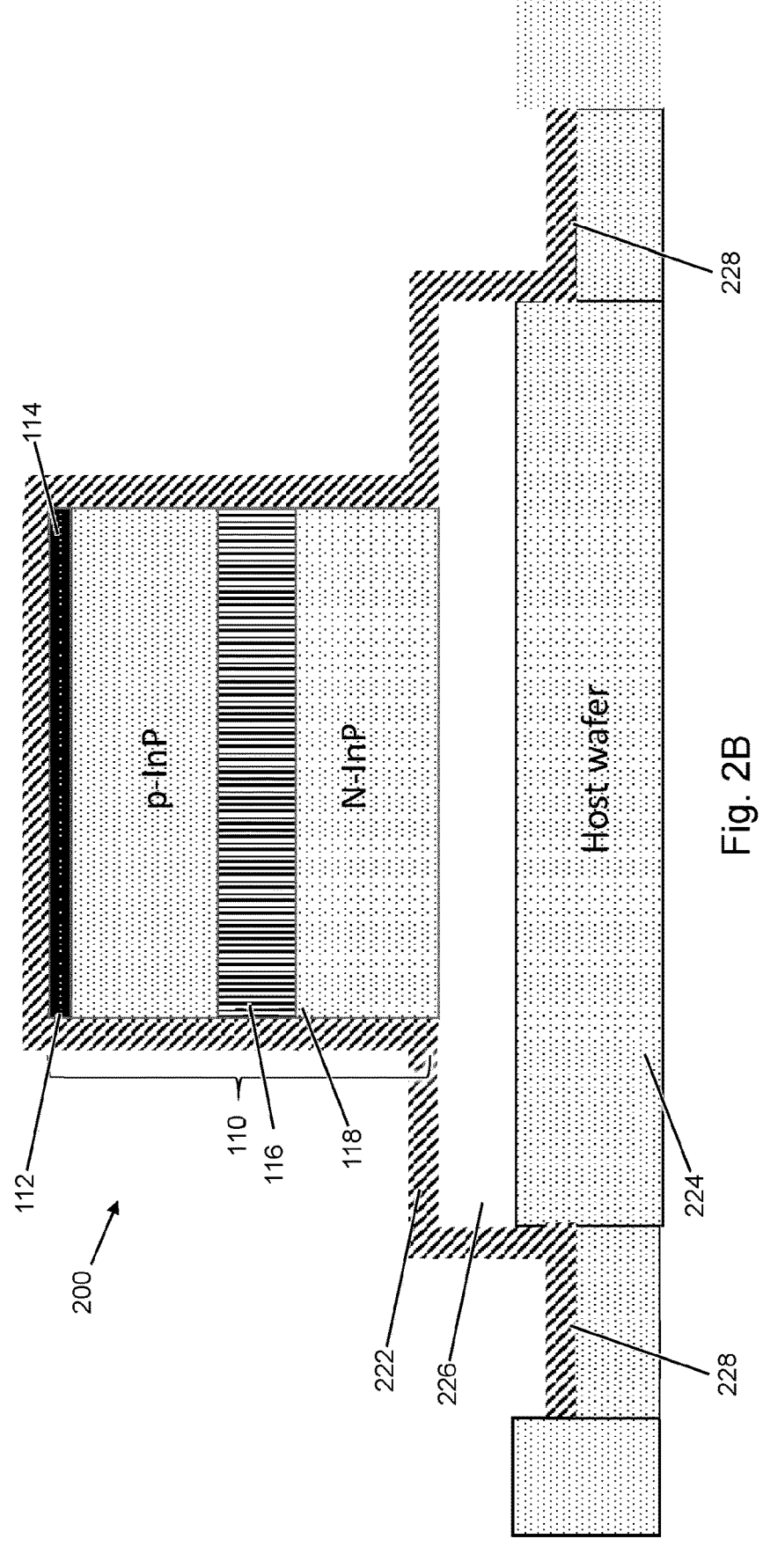
FIG. 2B shows the variant coupon wafer of FIG. 2A after a release layer has been removed.

FIG. 2A shows a cross-sectional view of a variant coupon wafer 200. Where the variant coupon wafer 200 shares features with the coupon wafer(s) described previously, like features are indicated by like reference numerals. Coupon wafer 200 differs from the example shown, for example, in FIG. 1A, in that the tether 222 extends not only across the upper surface and sidewalls of the device coupon 110, but also along an upper surface of a release layer 220 which is wider than the device coupon residing upon it. The tether 222 extends along this upper surface, and then down a sidewall therefore into and along a channel 228 of the wafer substrate 224. FIG. 2B shows the variant coupon wafer of FIG. 2A after a release layer has been removed, and so a gap 226 exists between the device coupon 110 and the wafer substrate 224. The gap 226 being correspondingly wider than the device coupon 110 due to resulting from the removal of the wider release layer 220.

Figure 3A:
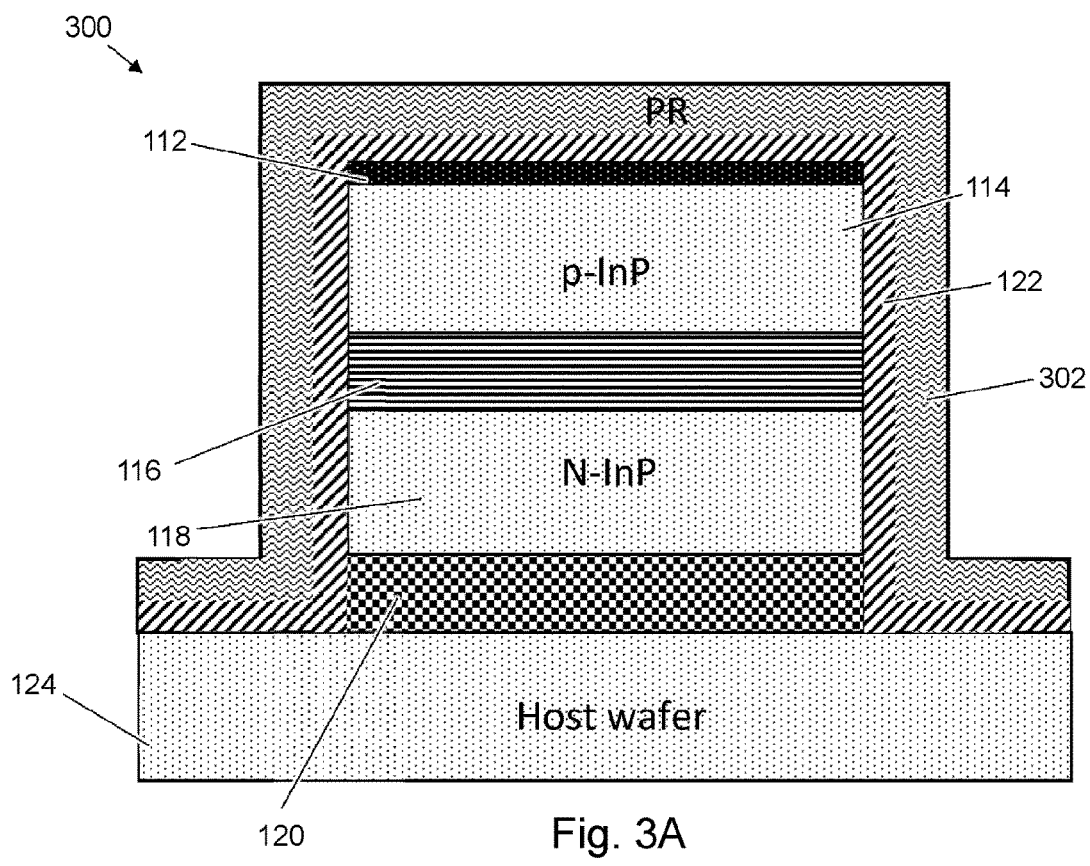
FIG. 3A shows a cross-sectional view of a variant coupon wafer.
Figure 3B:
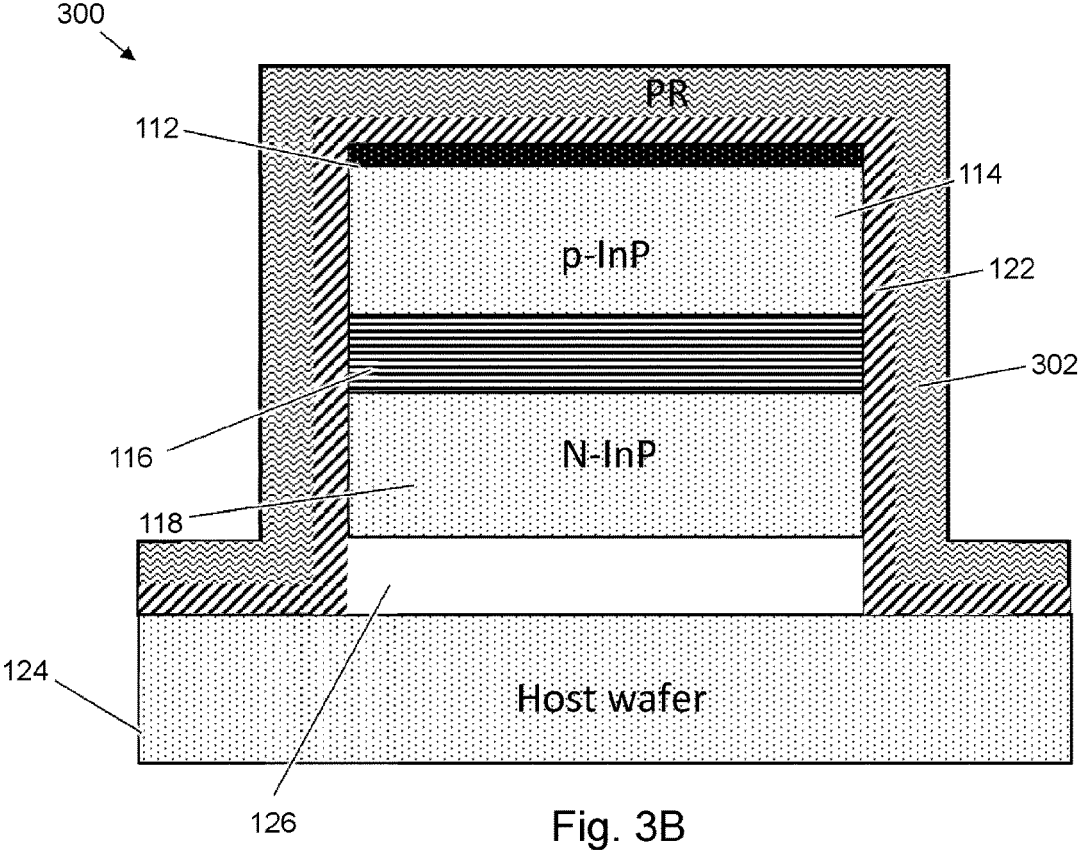
FIG. 3B shows the variant coupon wafer of FIG. 3A after a release layer has been removed.

FIG. 3A shows a cross-sectional view of a variant coupon wafer 300. Where the variant coupon wafer 300 shares features with the coupon wafer(s) described previously, like features are indicated by like reference numerals. Coupon wafer 300 differs from the example shown, for example, in FIG. 1A, in that a photoresist layer 302 is provided over the tether 122 to form a composite tether. In this example, the tether also extends along an upper surface of the substrate 124. FIG. 3B shows the variant coupon wafer of FIG. 3A after a release layer has been removed.

Figure 4A:
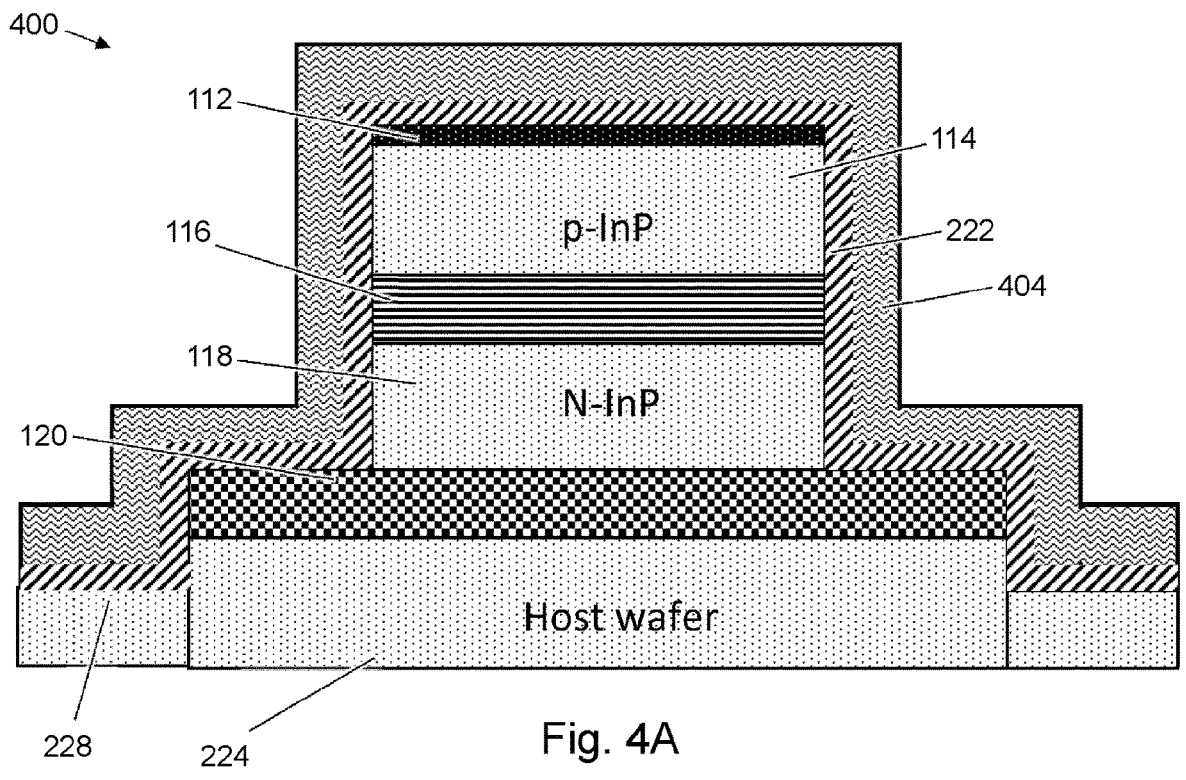
FIG. 4A shows a cross-sectional view of a variant coupon wafer.
Figure 4B:
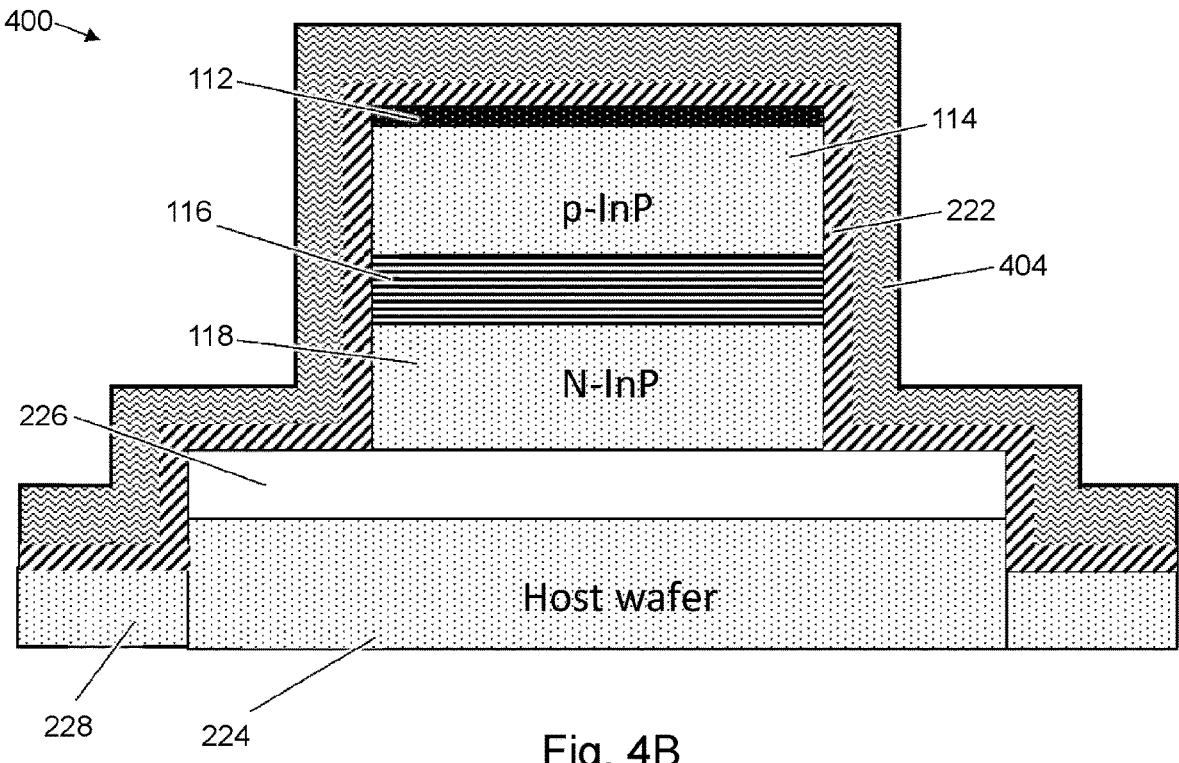
FIG. 4B shows the variant coupon wafer of FIG. 4A after a release layer has been removed.

FIG. 4A shows a cross-sectional view of a variant coupon wafer. Where the variant coupon wafer 400 shares features with the coupon wafer(s) described previously, like features are indicated by like reference numerals. Coupon wafer 400 differs from the example shown, for example, in FIG. 2A, in that a photoresist 404 is provided over the tether 402 to form a composite tether. FIG. 4B shows the variant coupon wafer of FIG. 4A after a release layer has been removed.

Figure 5A:
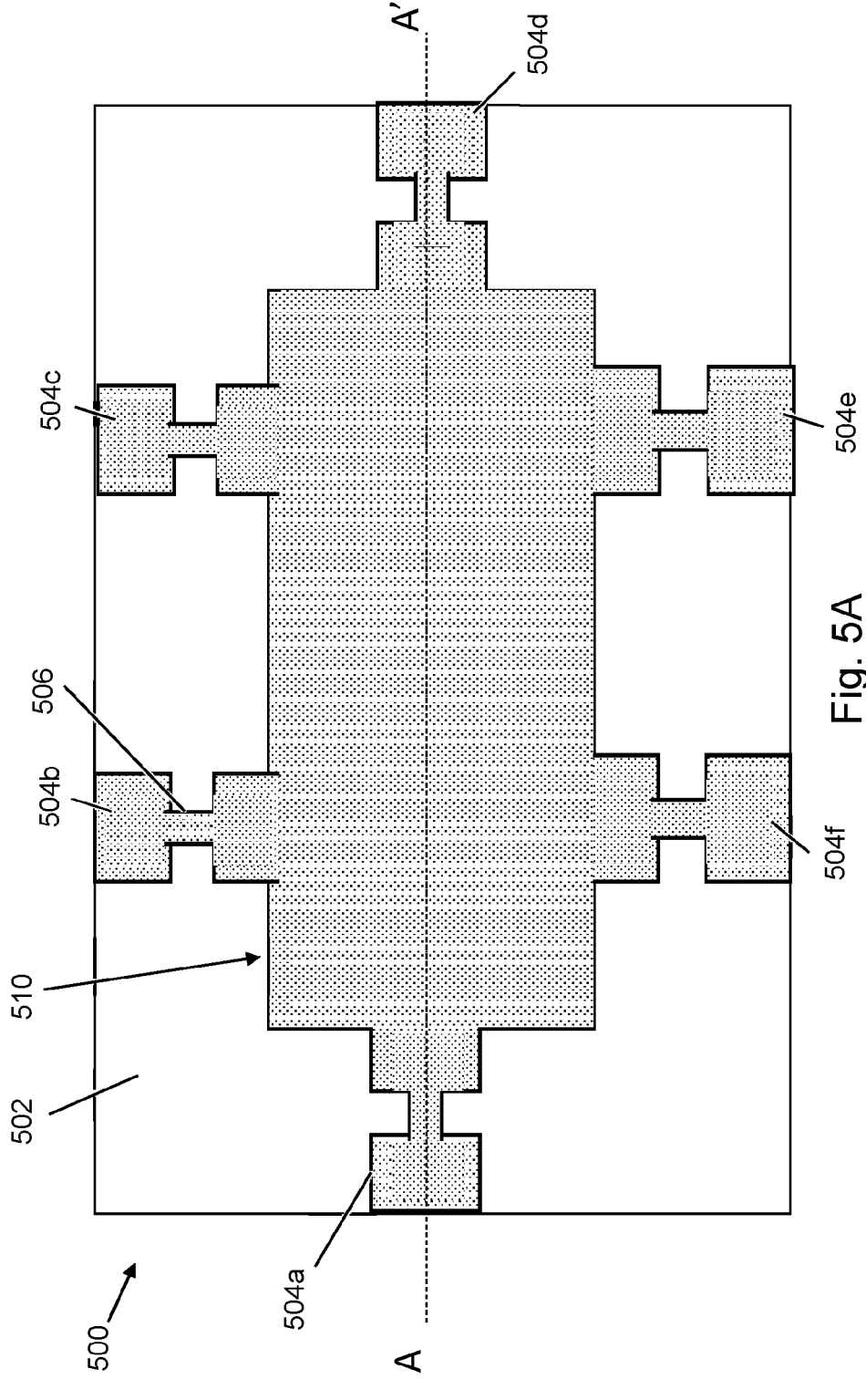
FIG. 5A shows a top-down view of a variant coupon wafer.

FIG. 5A shows a top-down view of a variant coupon wafer 500. Where the variant coupon wafer 500 shares features with the coupon wafer(s) described previously, like features are indicated by like reference numerals. As shown in the top-down view of FIG. 5A, the coupon wafer 500 includes six dielectric tethers 504a-504f, disposed around a perimeter of the device coupon 510. It is solely via these tethers (once the release layer has been removed) that the device coupon 510 is attached to the wafer substrate 502. In this example, each dielectric tether 504a-540f includes a tapered region 506 which is narrower than adjacent parts of the respective tether. This can help ensure that the tether breaks at the tapered region by introducing a structural weakness, when the device coupon is lifted from the coupon wafer.

Figure 5B:
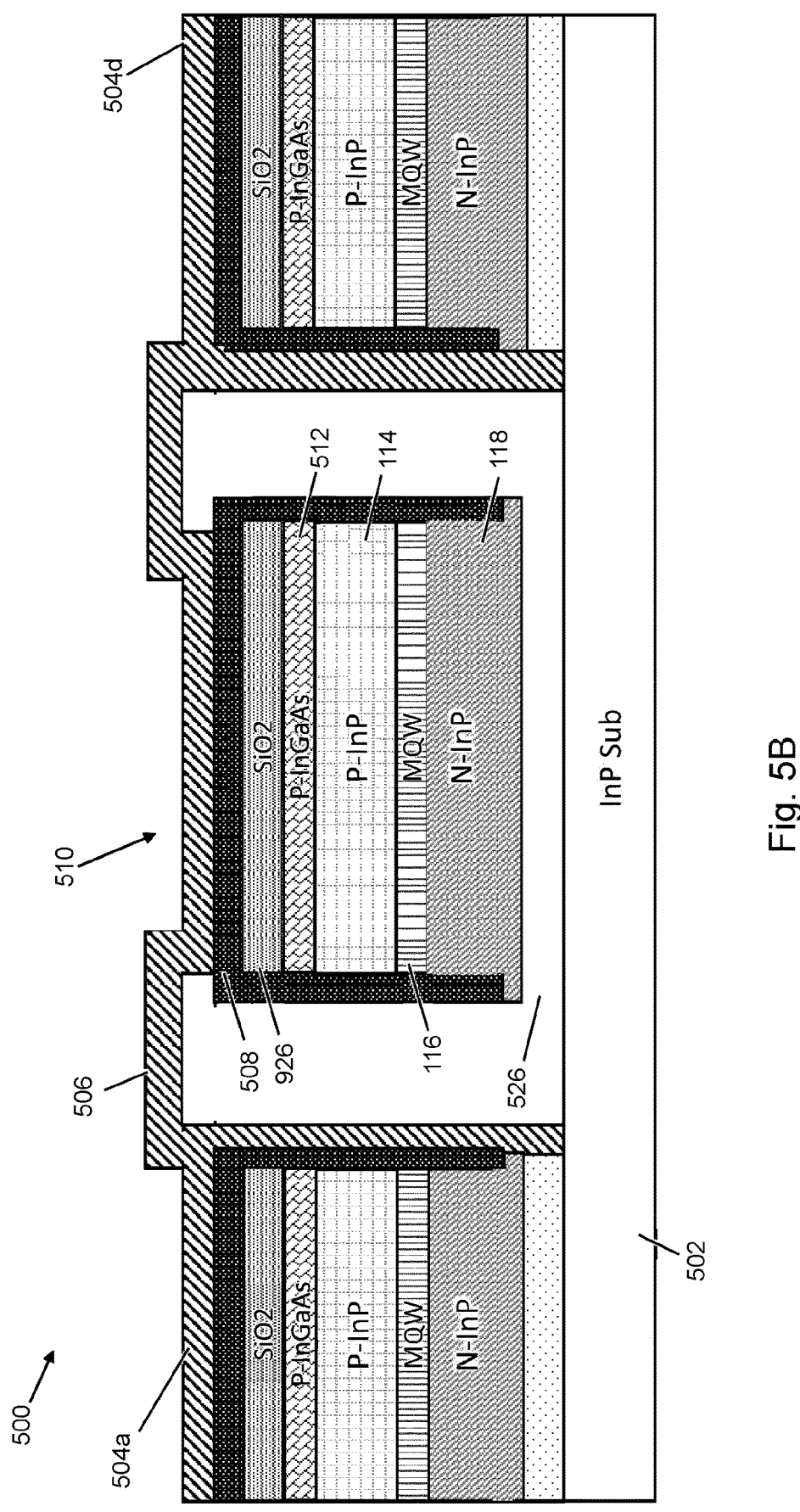
FIG. 5B shows a cross-sectional view of the variant coupon wafer of FIG. 5A along the line A-A'.

FIG. 5B shows a cross-sectional view of the variant coupon wafer 500 of FIG. 5A along the line A-A'. As before, the coupon wafer 500 includes a device coupon 510 formed of a plurality of layers. In contrast to the previous device coupons, device coupon 510 includes an additional P doped indium gallium arsenide layer 512 as well as silicon dioxide layer 926. The coupon wafer 500 differs from previous examples in that the device coupon 510 resides within a cavity of the coupon wafer. The device coupon is at least partially encapsulated by antireflective coating 508 and is separated from the substrate 502 by gap 526. It is attached to sidewalls of the cavity of the coupon wafer by tethers 504a-504d. The space between the coupon wafer and the sidewalls forms a channel (in this example, a channel which extends around the entire perimeter of the device coupon).

Figures 6A, 6B:
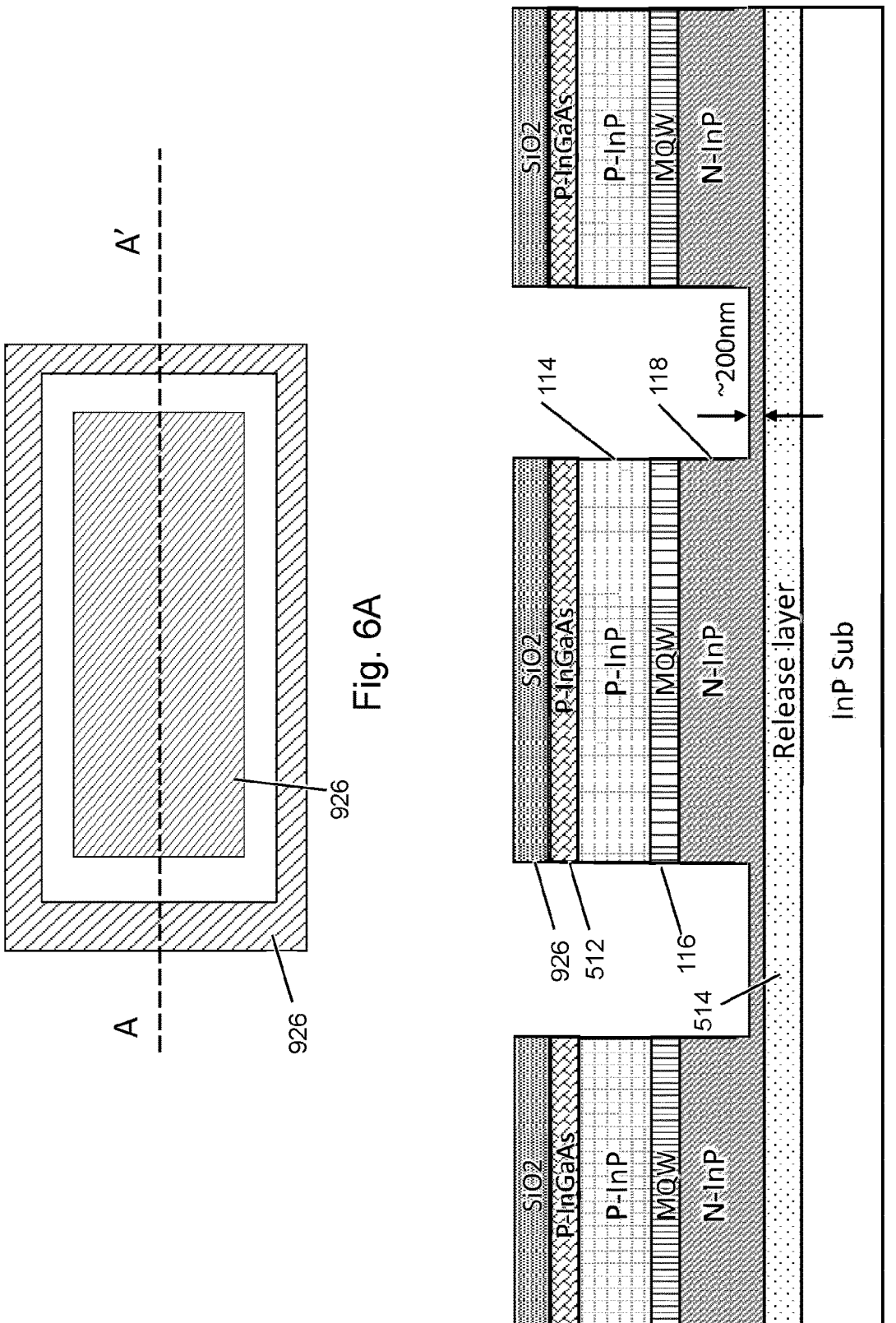
FIG. 6A is a top-down view of a manufacturing step of the variant coupon wafer of FIG. 5A.
FIG. 6B is a cross-sectional view of FIG. 6A along the line A-A'.

FIG. 6A is a top-down view of a manufacturing step of the variant coupon wafer of FIG. 5A, and FIG. 6B is a cross-sectional view of FIG. 6A along the line A-A'. In an initial step, not shown, a multi-layered stack is grown from the substrate. The composition of the multi-layered stack at least partially defining the composition of the device coupon when fabricated. In this example, a six layer stack is formed having the following layers going from a layer closest to the substrate to a layer distalmost from the substrate: release layer 514; N doped indium phosphide layer 118, multiple quantum well layer 116, P doped indium phosphide layer 114, p doped indium gallium arsenide layer 512, and silicon dioxide layer 926. In the step shown FIGS. 6A and 6B, the silicon dioxide layer 926 has just been deposited and patterned to provide a hard mask over the device coupon and sidewalls, and the unmasked areas etched. The etch is stopped around 200 nm above the release layer surface.

Figure 7:
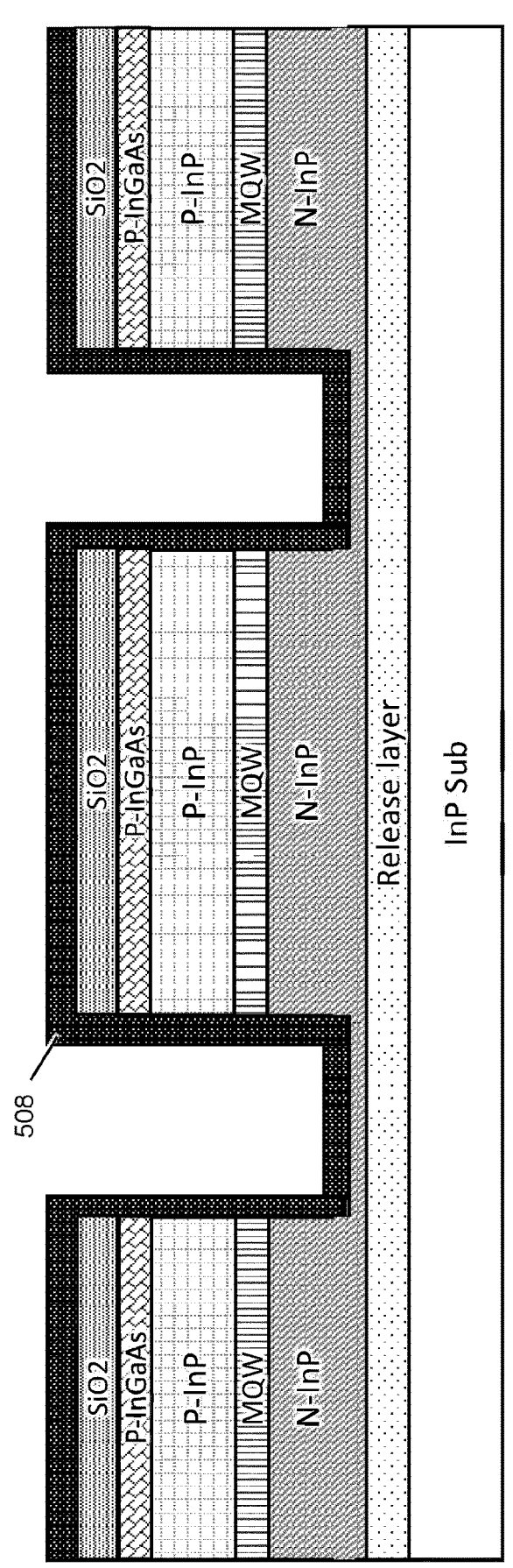
FIGS. 7-10 show cross-sectional views of various manufacturing steps of the variant coupon wafer of FIG. 5A.
Figure 8:
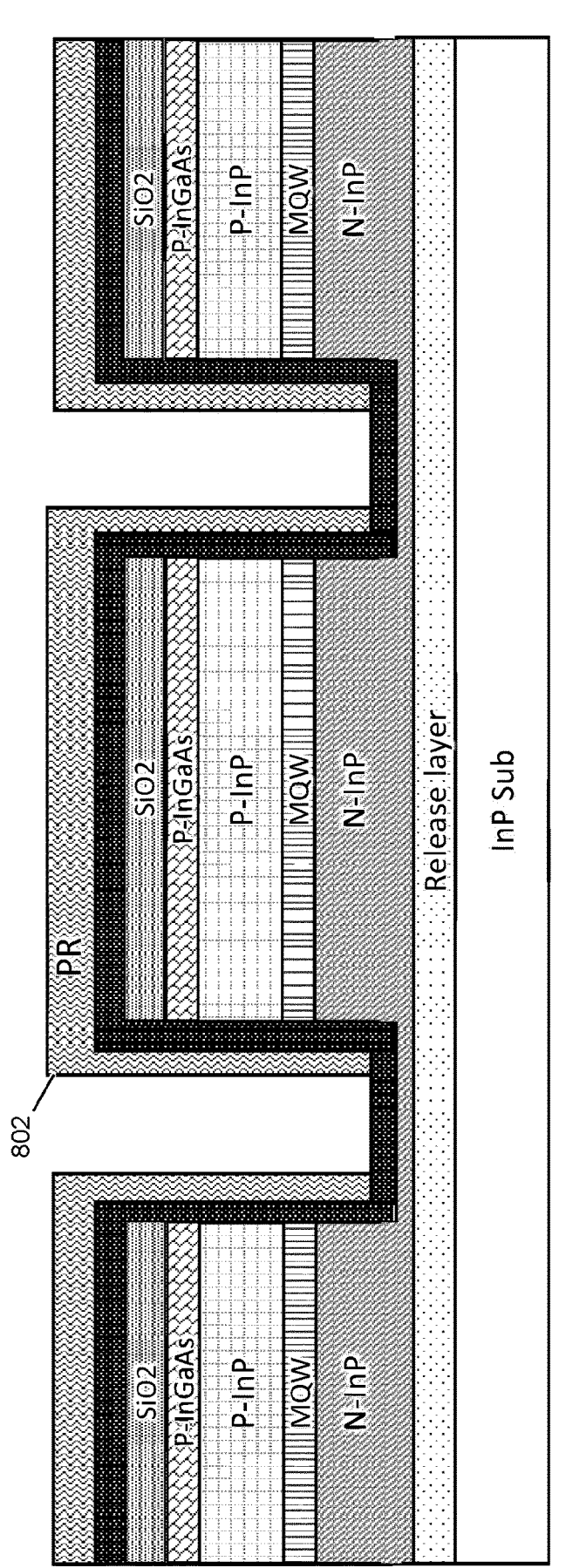
Figure 9:
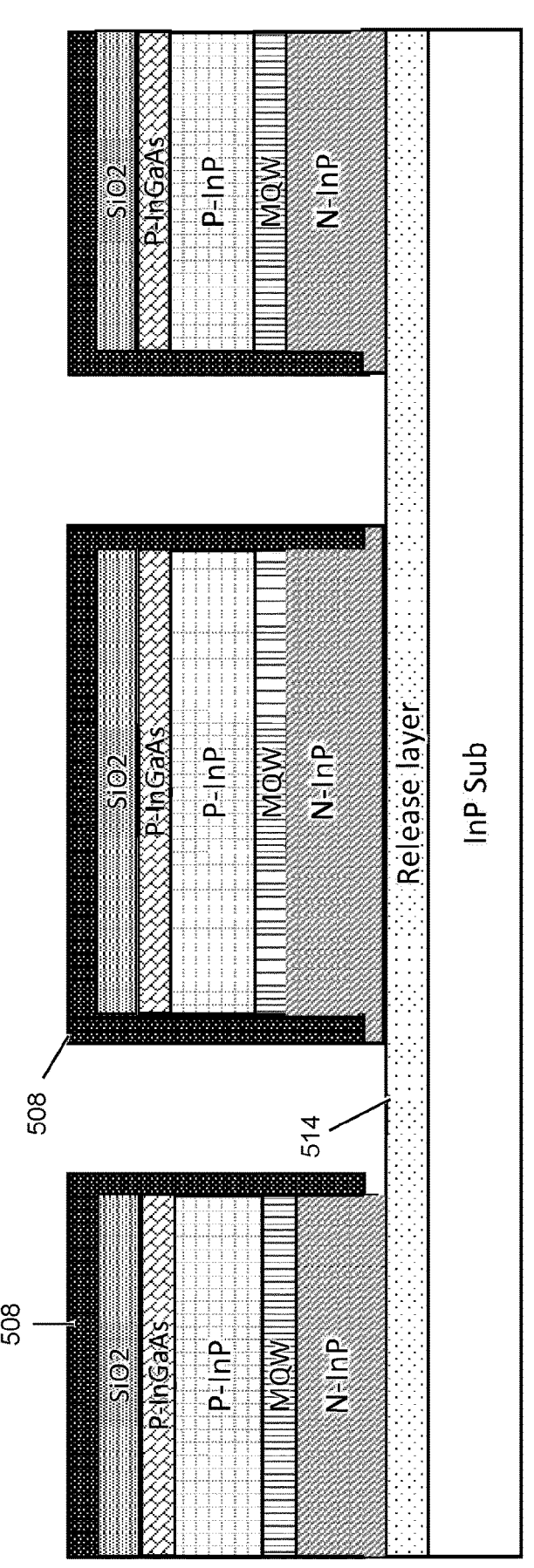

FIGS. 7-10 show cross-sectional views of various manufacturing steps of the variant coupon wafer of FIG. 5A. In FIG. 7, an antireflective coating 508 is deposited over the exposed surfaces of the coupon wafer. Subsequently, as shown in FIG. 8, a photoresist 802 is deposited and patterned so that a portion of the bed of the channel surrounding the device coupon is exposed. An etch is then performed, the result of which is shown in FIG. 9. In contrast to the example discussed below, this etch is performed so that no ledges are provided around the perimeter of the device coupon. The etch exposes an upper surface of the release layer 514, whilst retaining the antireflective coating 508 both around the device coupon and also on the sidewall and upper surface of the remaining coupon wafer.

Figure 10:
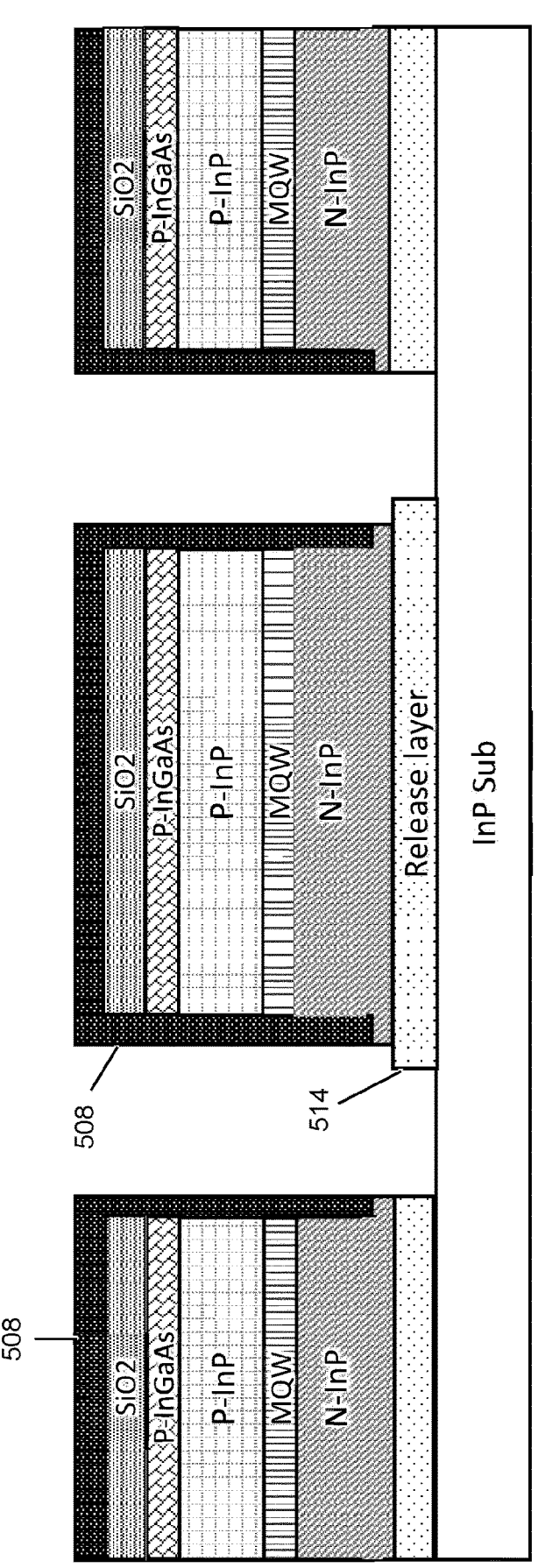
Figures 11A, 11B:
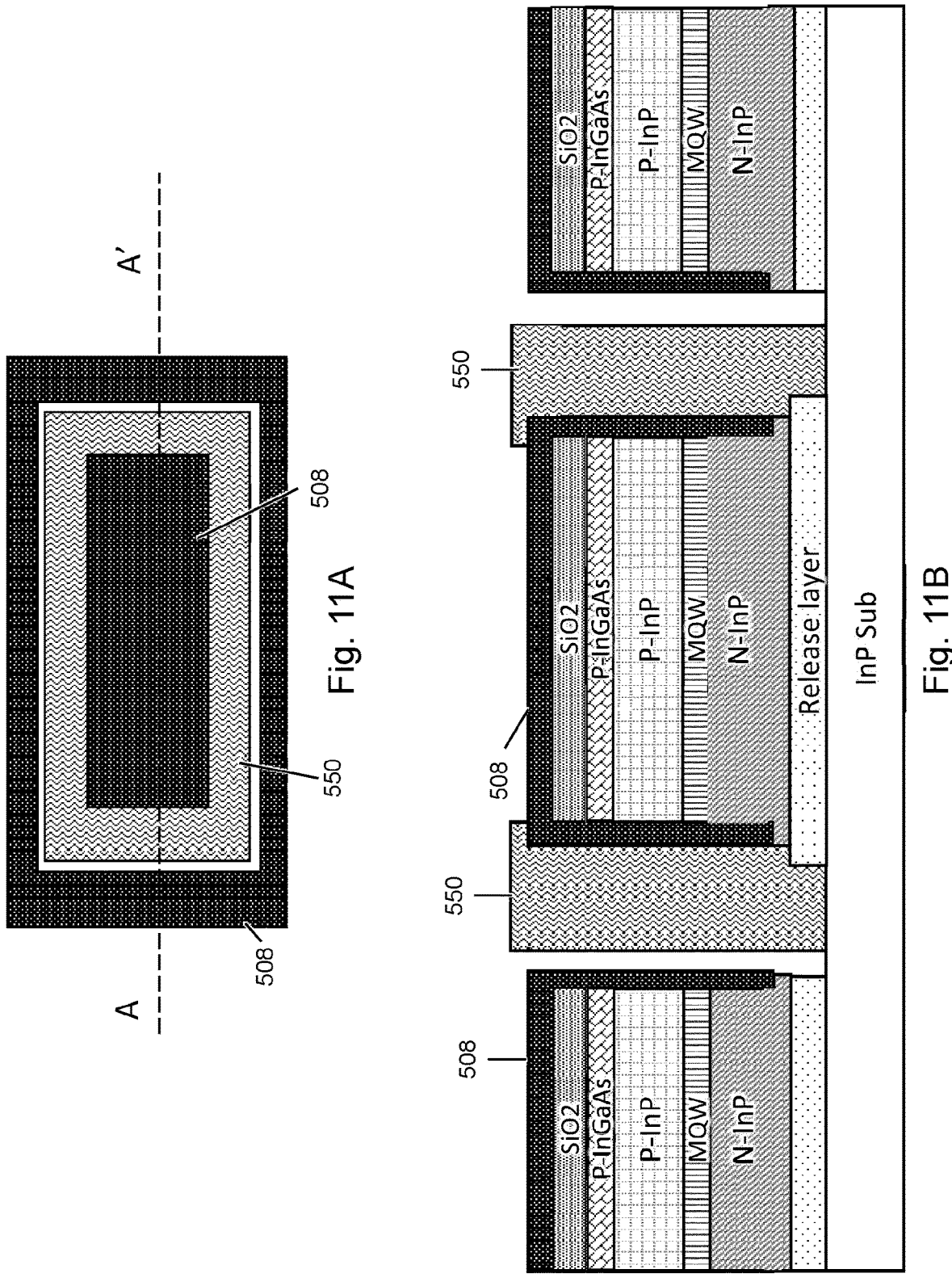
FIG. 11A is a top-down view of a manufacturing step of the variant coupon wafer of FIG. 5A.
FIG. 11B is a cross-sectional view of FIG. 11A along the line A-A'.
Figures 12A, 12B:
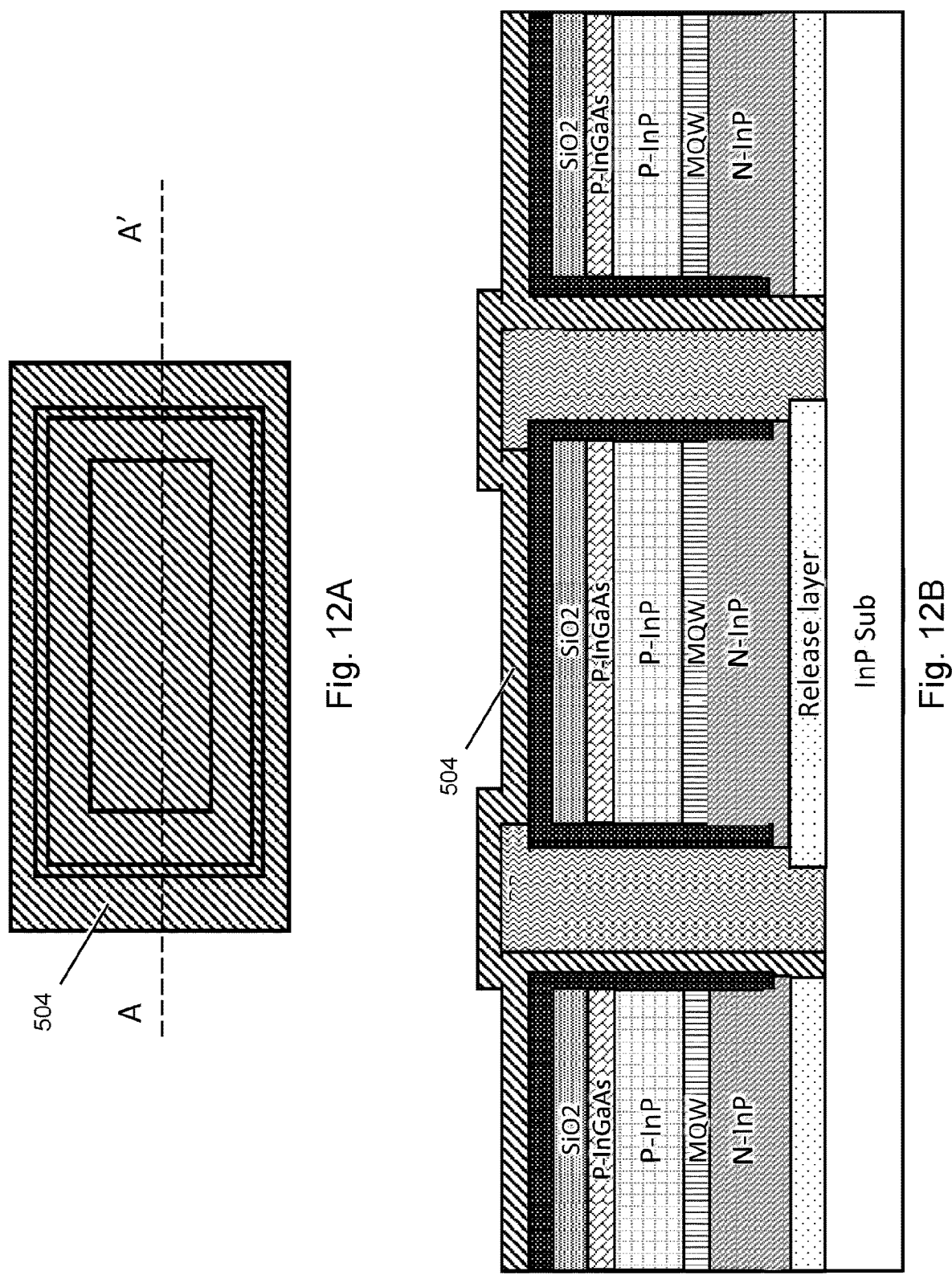
FIG. 12A is a top-down view of a manufacturing step of the variant coupon wafer of FIG. 5A.
FIG. 12B is a cross-sectional view of FIG. 12A along the line A-A'.
Figure 25:
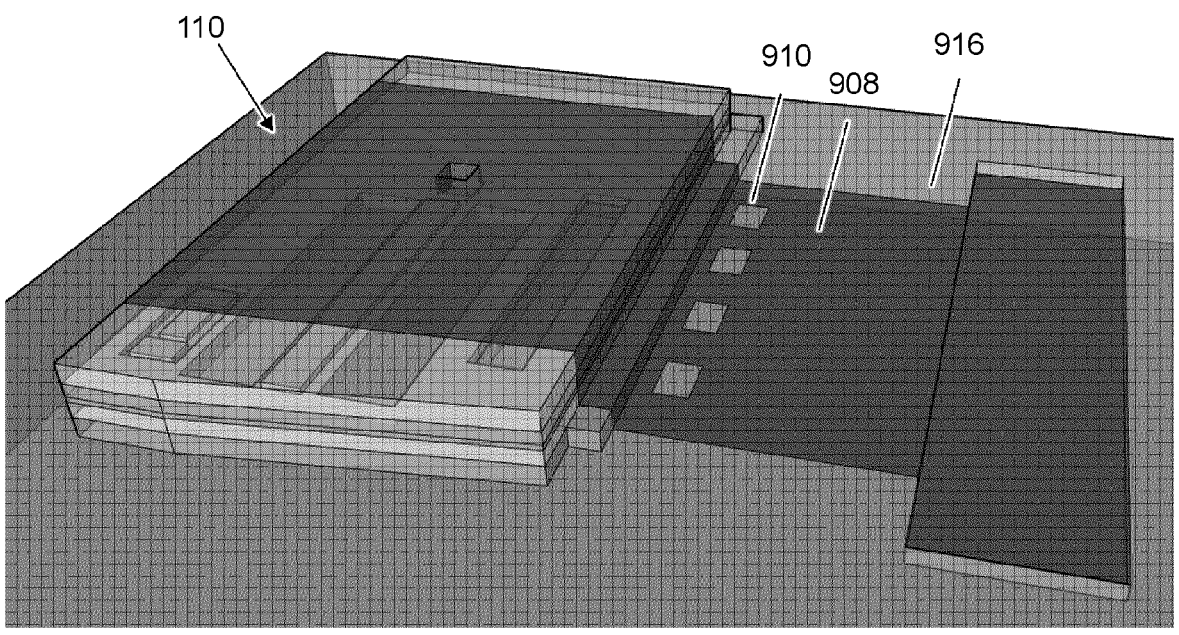

Next, as shown in FIG. 10, a grating (best seen in FIG. 25) is etched through the release layer 514 to expose portions of the substrate. FIG. 11A is a top-down view of a manufacturing step of the variant coupon wafer of FIG. 5A, and FIG. 11B is a cross-sectional view of FIG. 11A along the line A-A'. In this step, a photoresist 550 is patterned and defined so as to at least partially fill the channel surrounding the device coupon. In this example, a gap remains between the photoresist 550 fill and the sidewalls of the coupon wafer. In other examples, no gap remains and the photoresist 550 entirely fills the channel. FIG. 12A is a top-down view of a manufacturing step of the variant coupon wafer of FIG. 5A, and FIG. 12B is a cross-sectional view of FIG. 12A along the line A-A'. In this step, the dielectric tether 504 is deposited (e.g. via sputtering or evaporation deposition). In the example shown, because of the gap between the photoresist 550 and the sidewall, the dielectric tether 504 between the fill and the sidewall of the coupon wafer.

Figures 13A, 13B:
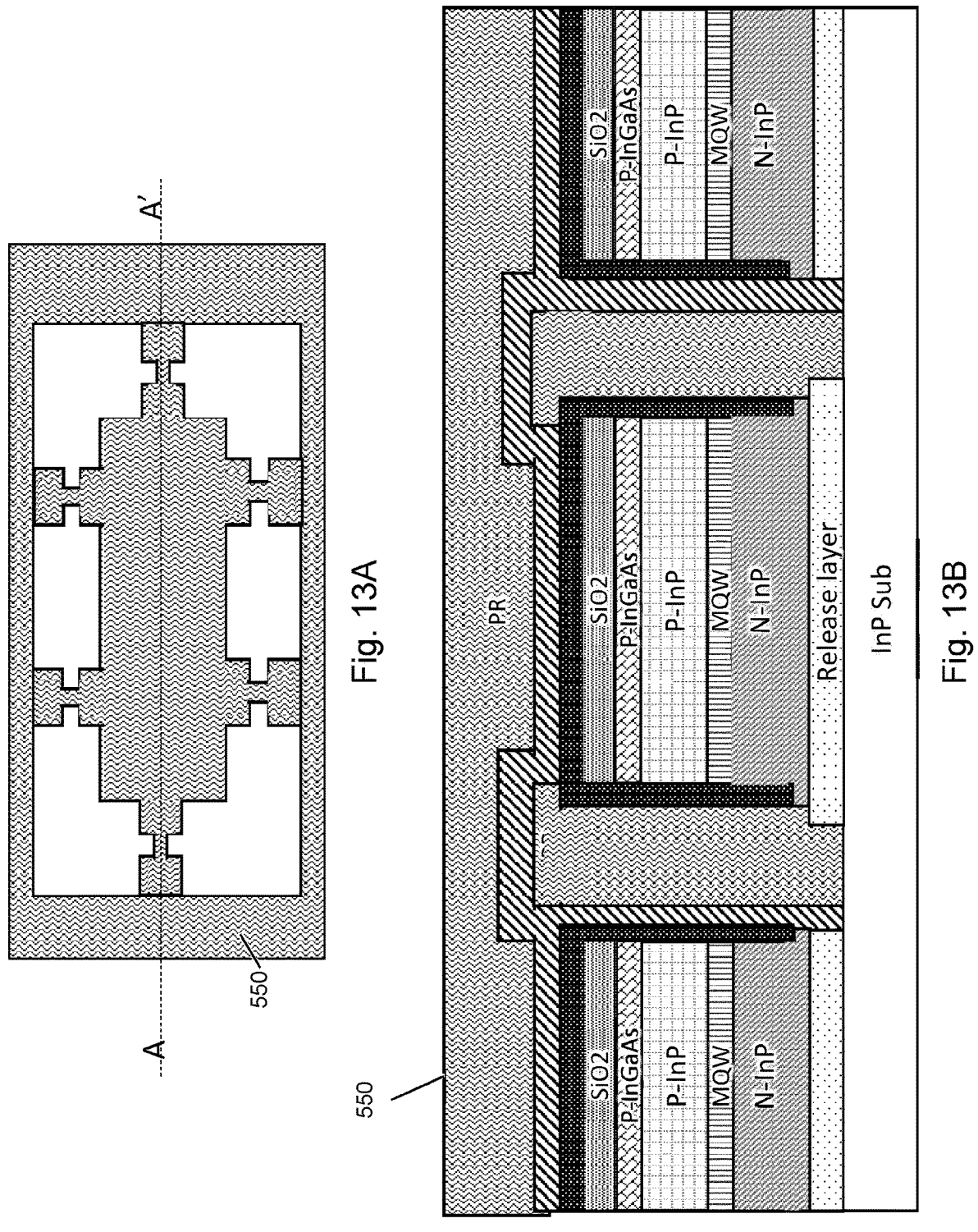
FIG. 13A is a top-down view of a manufacturing step of the variant coupon wafer of FIG. 5A.
FIG. 13B is a cross-sectional view of FIG. 13A along the line A-A'.
Figures 14A, 14B:
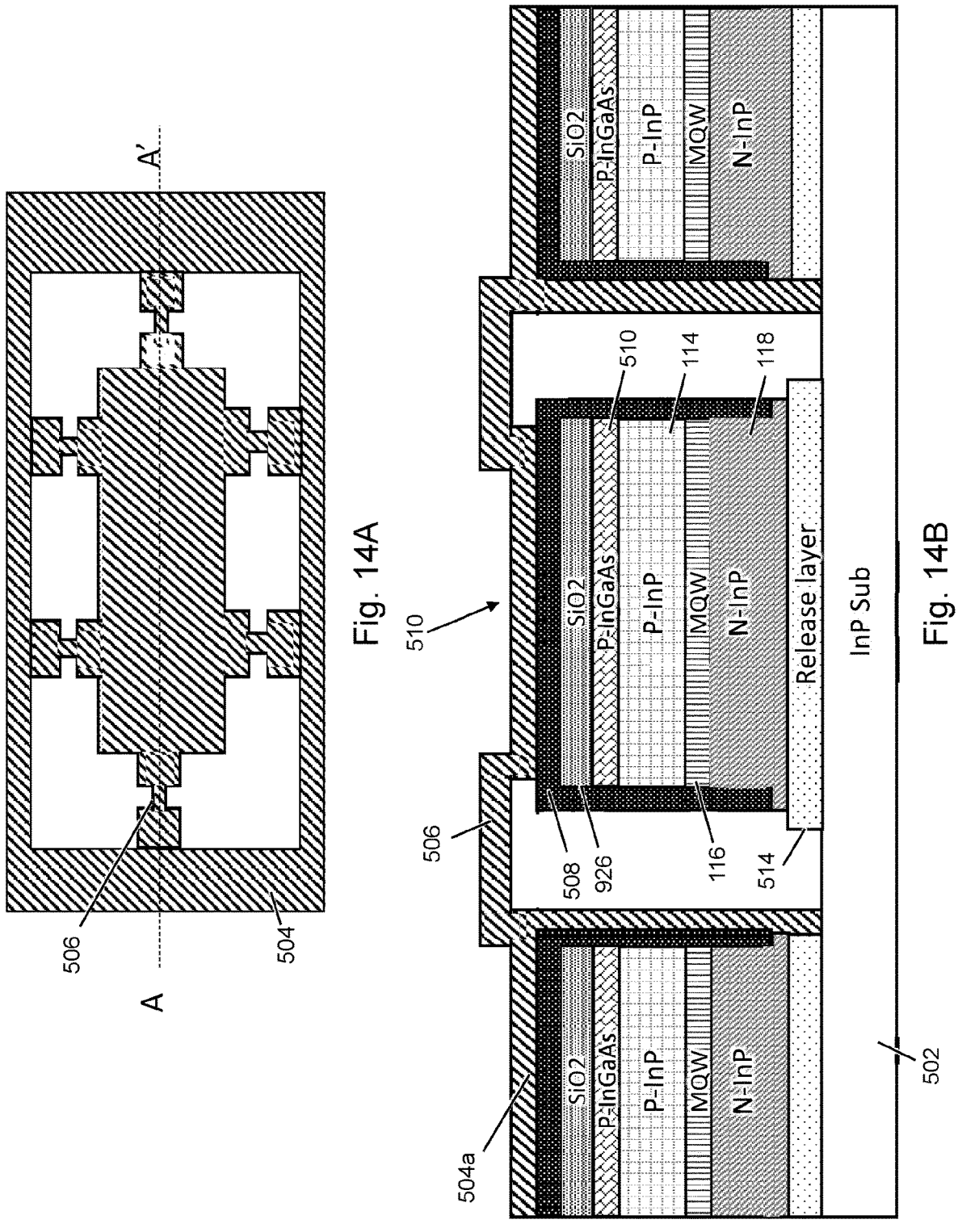
FIG. 14A is a top-down view of a manufacturing step of the variant coupon wafer of FIG. 5A.
FIG. 14B is a cross-sectional view of FIG. 14A along the line A-A'.
Figures 15A, 15B:
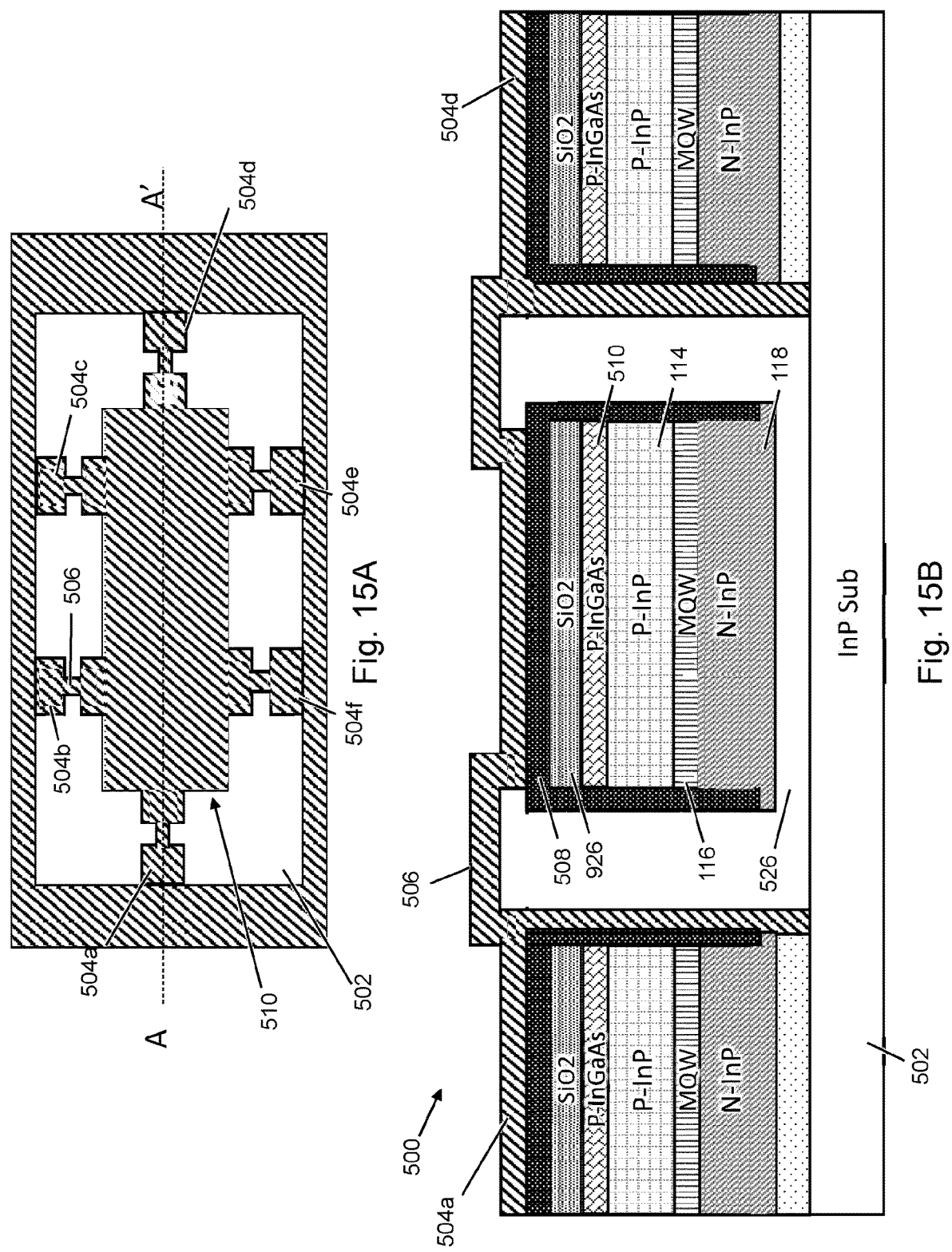
FIG. 15A is a top-down view of a manufacturing step of the variant coupon wafer of FIG. 5A.
FIG. 15B is a cross-sectional view of FIG. 12A along the line A-A'.

FIG. 13A is a top-down view of a manufacturing step of the variant coupon wafer of FIG. 5A, and FIG. 13B is a cross-sectional view of FIG. 13A along the line A-A'. In this step, a further photoresist 550 is provided to define the eventual dielectric tether. This is best seen in FIG. 13A, where the photoresist has a shape which substantially matches the geometry of the final dielectric tether. FIG. 14A is a top-down view of a manufacturing step of the variant coupon wafer of FIG. 5A, and FIG. 14B is a cross-sectional view of FIG. 14A along the line A-A'. In this step, the unmasked dielectric is etched, and then all photoresist removed. FIG. 15A is a top-down view of a final manufacturing step of the variant coupon wafer of FIG. 5A, and FIG. 15B is a cross-sectional view of FIG. 12A along the line A-A'. In this step, the release layer 514 is etched away so as to release the device coupon 510 from the substrate 502.

Figure 16:
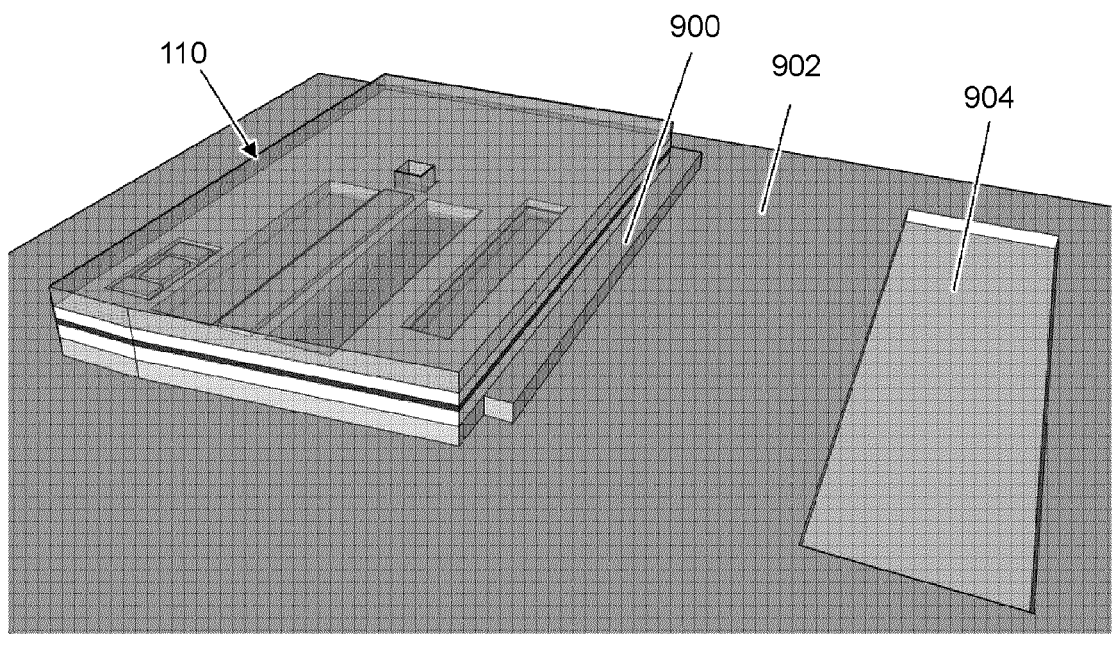
FIGS. 16-20B show perspective views of various manufacturing steps of a coupon wafer.
Figure 17:
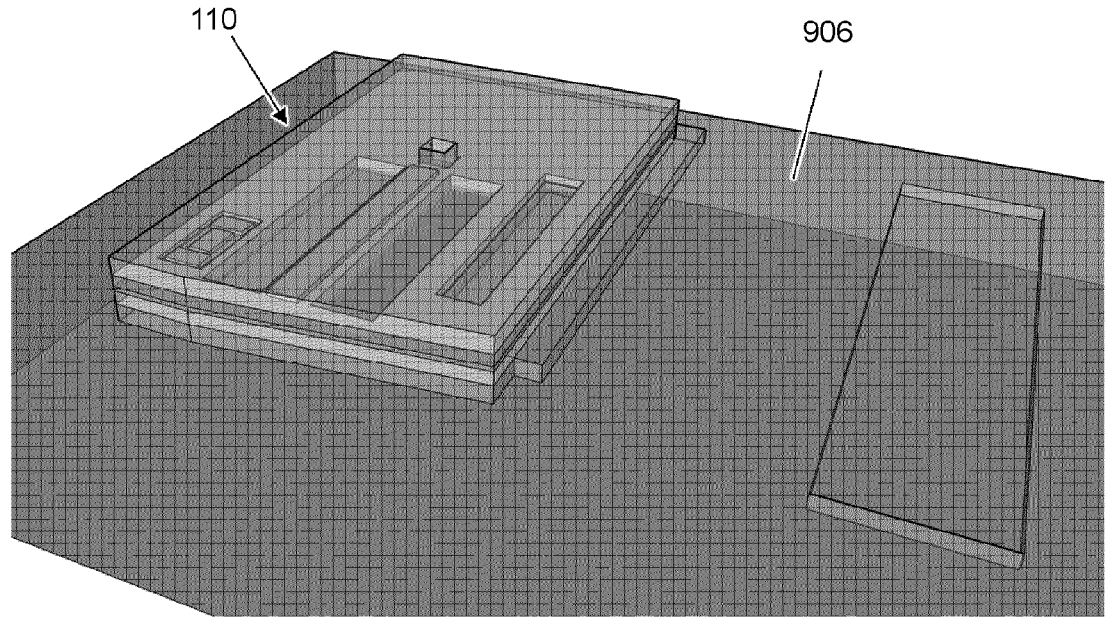
Figure 18:
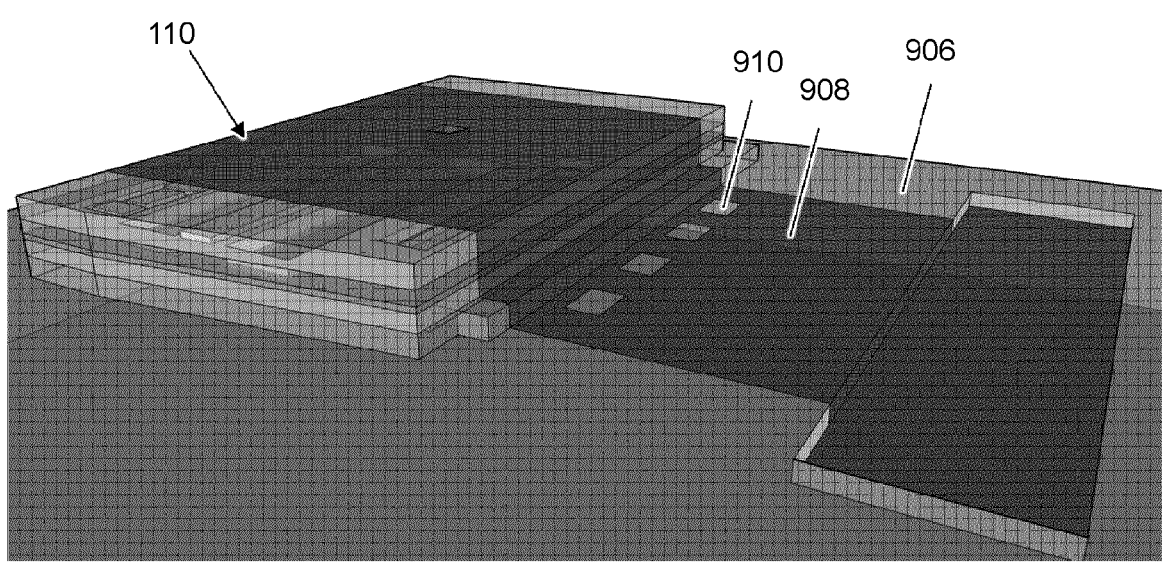

FIGS. 16-20B show perspective views of various manufacturing steps of a coupon wafer. Initial steps, not shown, include (i) forming the device coupon 110 in a manner known per se in the art; (ii) etching a facet onto the device coupon (this step is optional, and used when an angled facet as shown in FIG. 16 is desired); (iii) creating ledges 900 on three sides of the device coupon, as shown in FIG. 16, but not on the facet side of the device coupon (this step is also optional, as discussed above); (iv) perform an etch to expose the release layer 902; and (v) create a trench (e.g. a rectangular trench) and etch to the substrate 904. FIG. 17 shows a subsequent step, where antireflective coating 906 is deposited over the exposed surfaces of the coupon wafer. After this, in a step shown in FIG. 18, a photoresist 908 is spun onto the device coupon and then patterned to define the eventual tether and apertures 910 (providing a grating) through which the release layer will be exposed.

Figure 19:
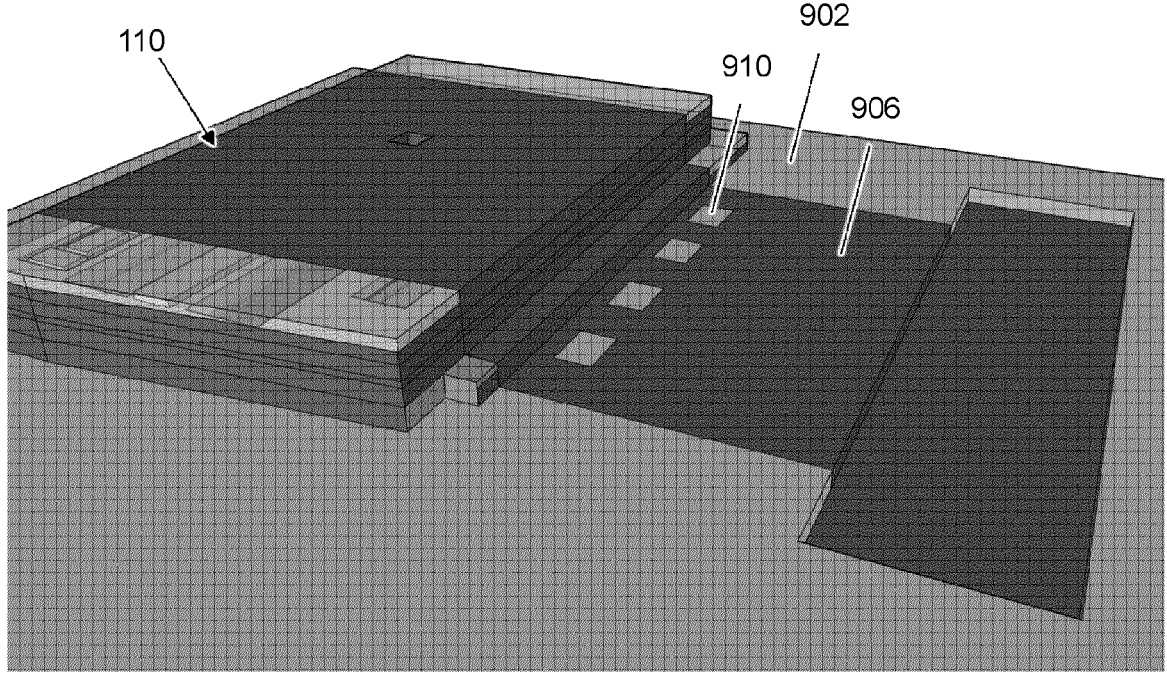
Figure 20A:
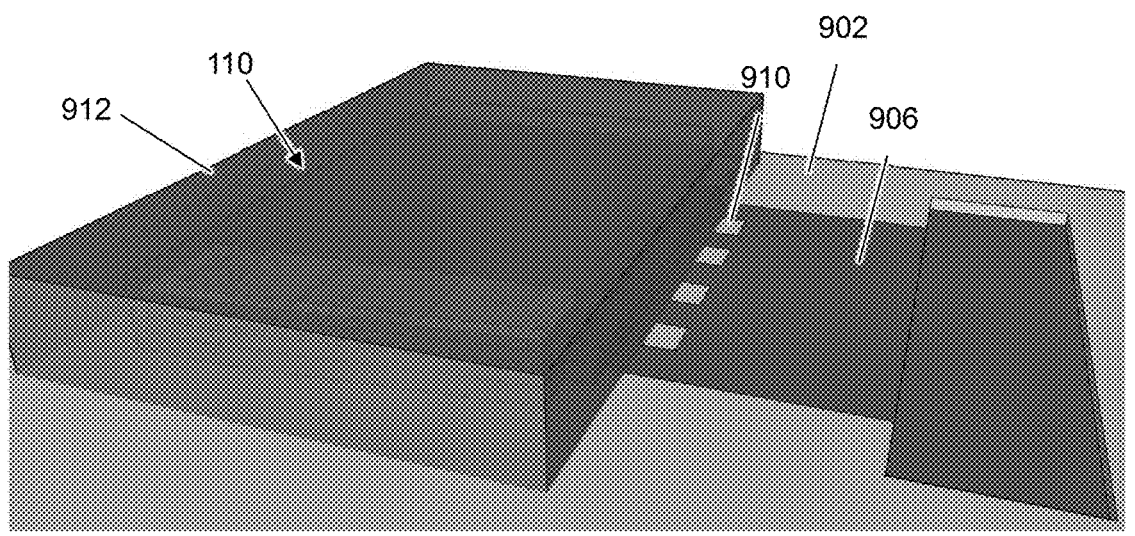
Figure 20B:
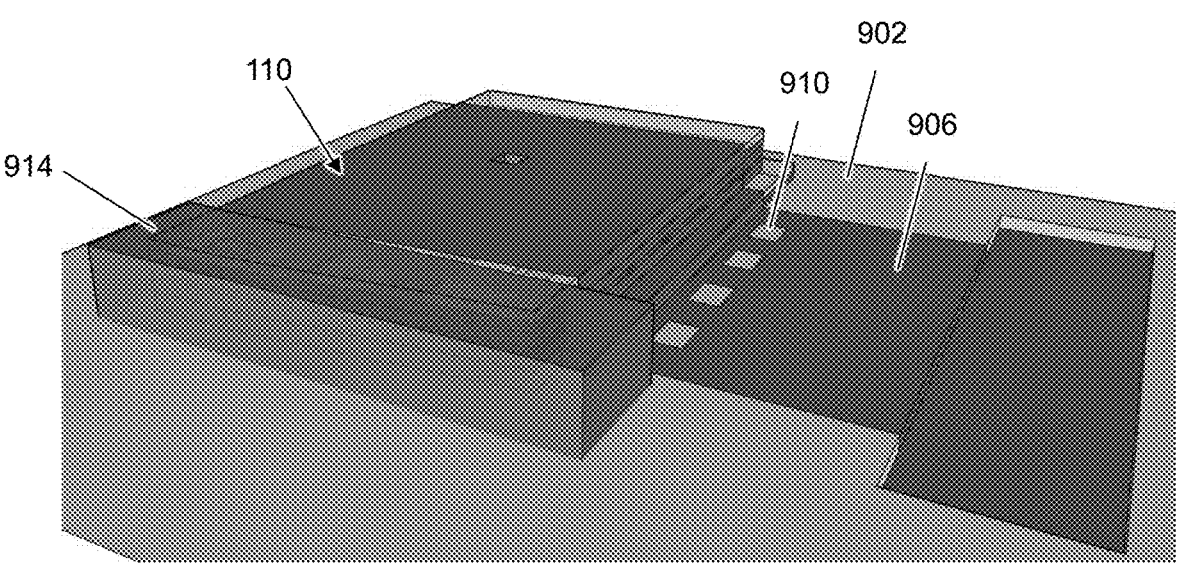

Next, the unmasked antireflective coating 906 is etched to expose the top of the release layer 902 and the photoresist is then removed. The result of this is shown in FIG. 19. The apertures, forming a grating, provide penetration points for an etchant used to remove the release layer 902. The antireflective coating still covers the facet of the device coupon, as well as the sidewalls. The area between the grating and the trench can be tapered if required to make the tethers locally weaker to facilitate better breaking during printing. FIGS. 20A and 20B show two options for a subsequent processing step. In the step shown in FIG. 20A, a photoresist 912 is patterned to cover the entire device coupon 110. In an alternative, shown in FIG. 20B, only the facet is covered in a photoresist 914. The photoresist in FIG. 20B minimises the risk of causing failure of the tethers by only imparting a minimal amount of force to the device coupon. Both photoresists function to protect the facet from wet etchant leakage in the active region and metal contact layer. After release, and before print, the photoresist is removed. As dielectric tethers are being used, the device coupon can be cleaned with IPA/acetone after release. As the resist is anchored to the substrate, it will provide support to the sample during release (e.g. from capillary forces).

Figure 21:
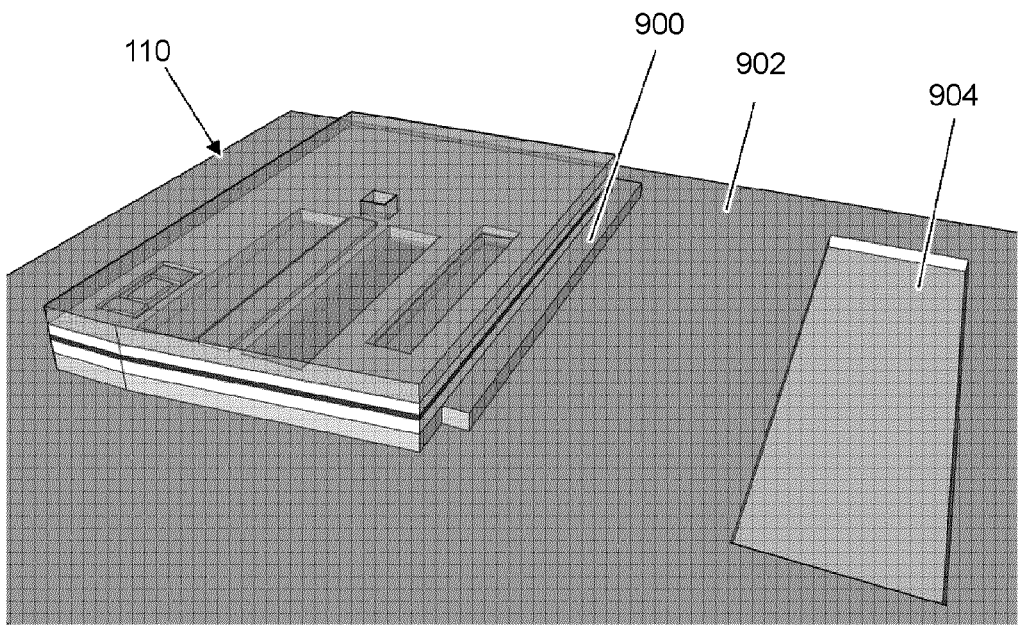
FIGS. 21-28B show perspective views of various manufacturing steps of a variant coupon wafer.
Figure 22:
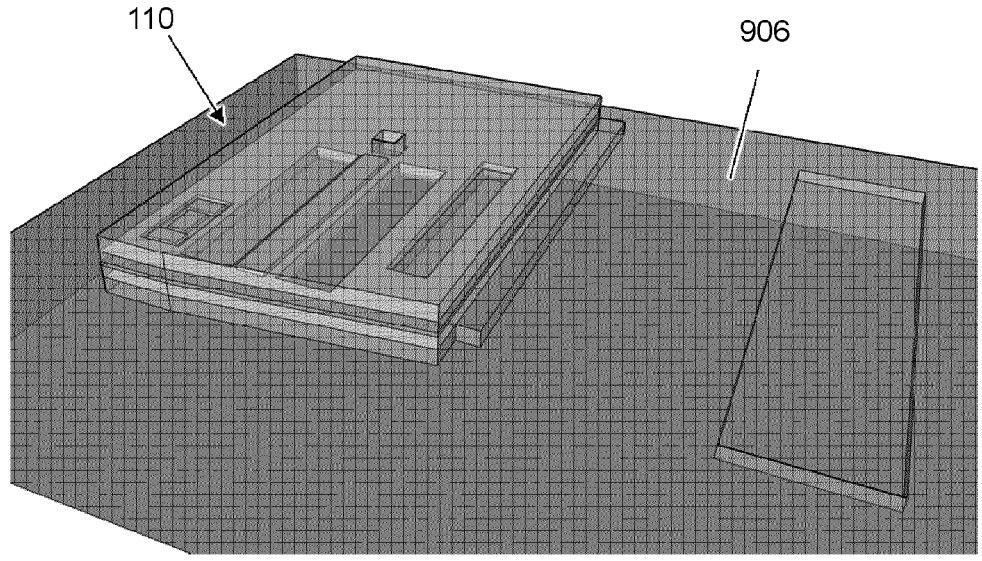
Figure 23:
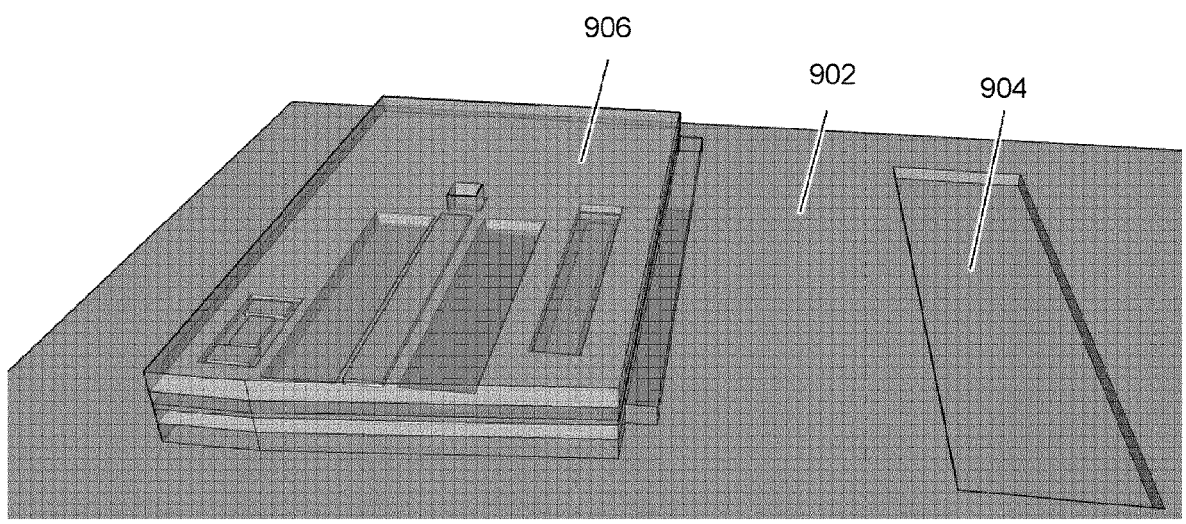

FIGS. 21-28B show perspective views of various manufacturing steps of a variant coupon wafer. Where it shares like features with the manufacturing steps of the coupon wafer shown in FIGS. 16-20B, like features are indicated by like reference numerals. Initial steps, not shown, include (i) forming the device coupon 110 in a manner known per se in the art; (ii) etching a facet onto the device coupon (this step is optional, and used when an angled facet as shown in FIG. 21 is desired); (iii) creating ledges 900 on three sides of the device coupon, as shown in FIG. 21, but not on the facet side of the device coupon (this step is also optional, as discussed above); (iv) perform an etch to expose the release layer 902; and (v) create a trench (e.g. a rectangular trench) and etch to the substrate 904. FIG. 22 shows a subsequent step, where antireflective coating 906 is deposited over the exposed surfaces of the coupon wafer. After this, in a step shown in FIG. 23, the antireflective coating on the surfaces coupon wafer are removed via an etch (retaining the antireflective coating on the device coupon and notably the facet).

Figure 24:
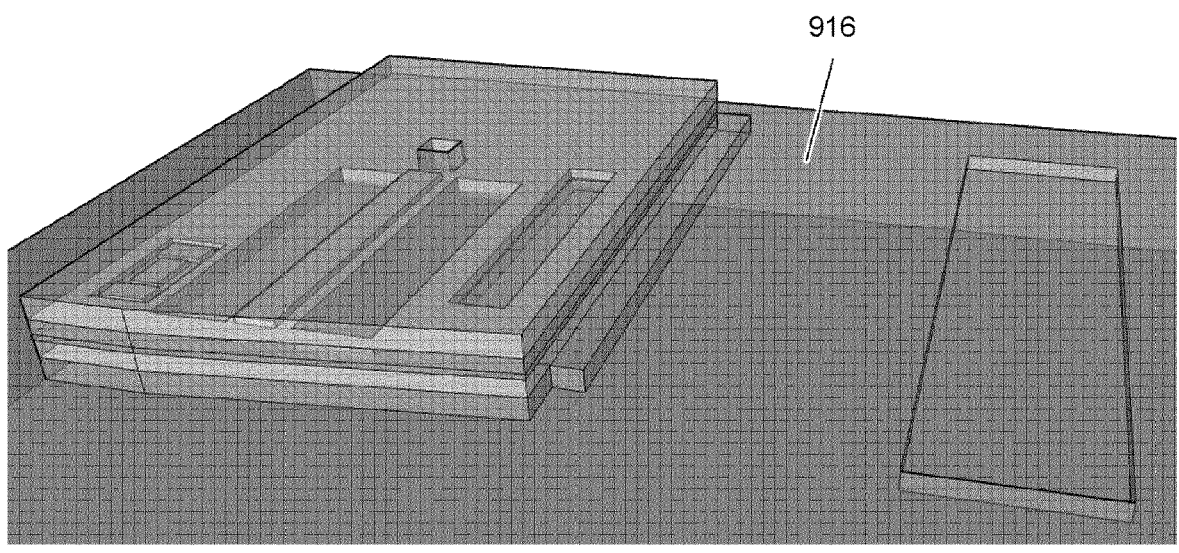
Figure 26:
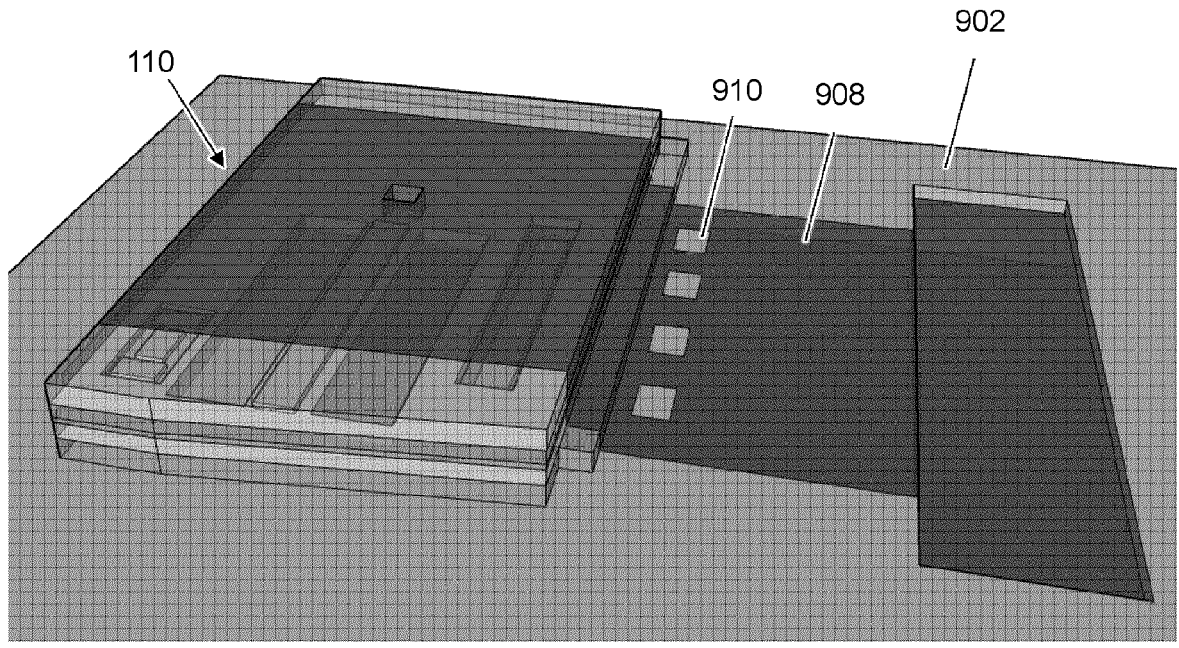
Figure 27:
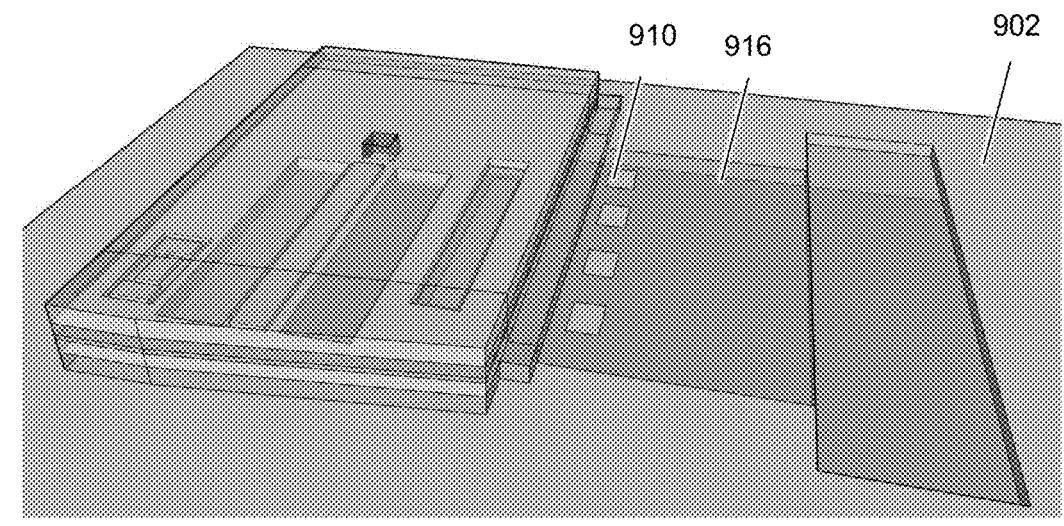
Figure 28A:
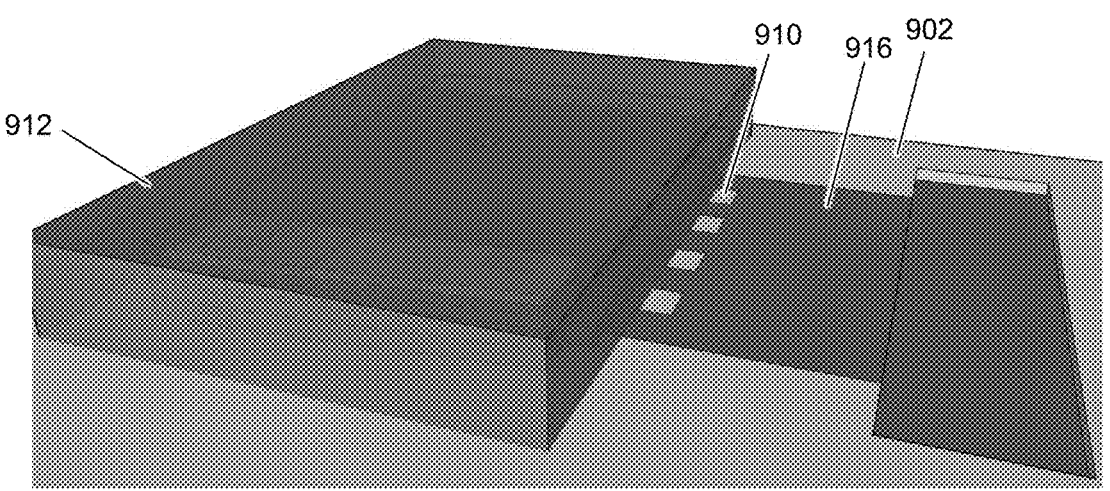
Figure 28B:
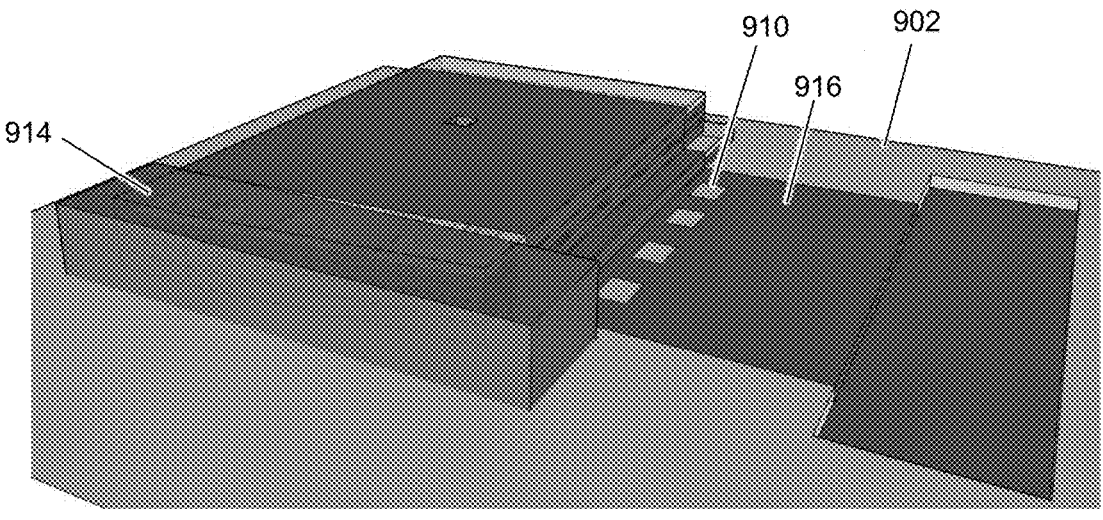
Figure 29A:
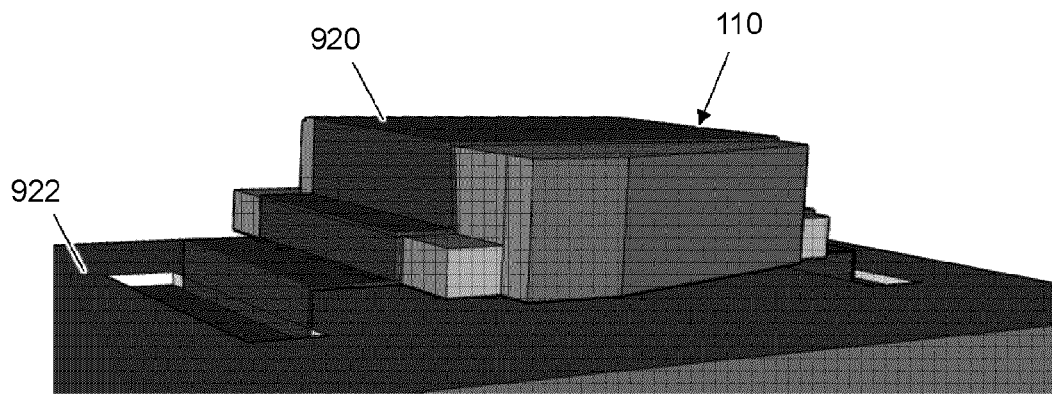
FIGS. 29A-29F show various perspective views of a coupon wafer after a release layer has been removed.
Figure 29B:
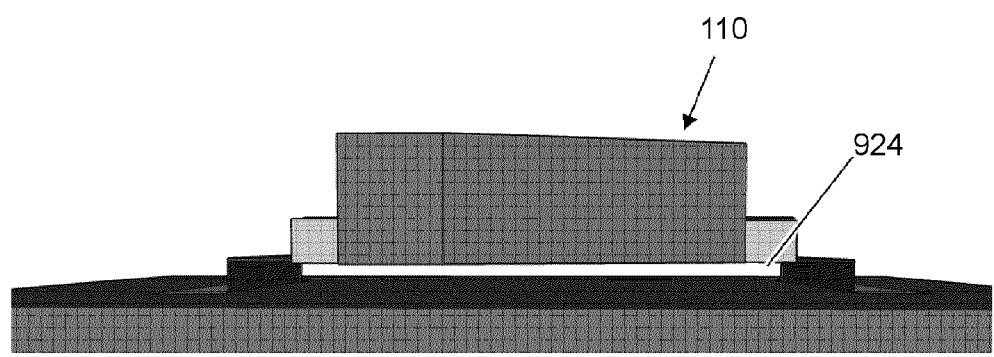
Figure 29C:
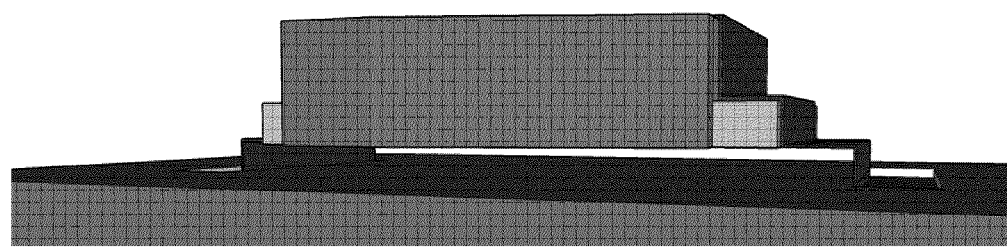
Figure 29D:
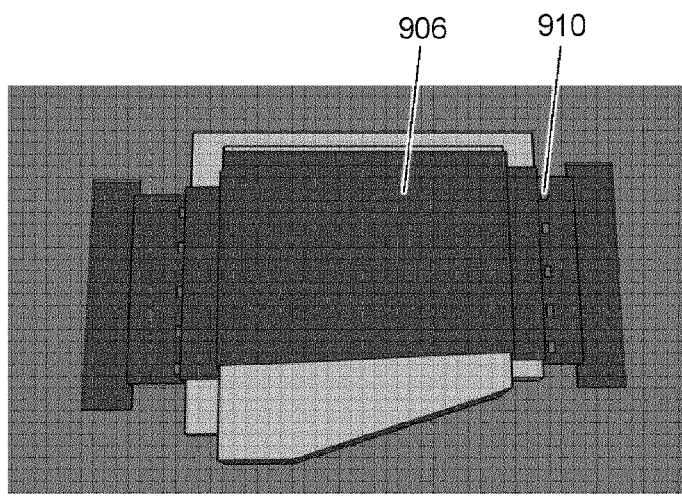
Figure 29E:
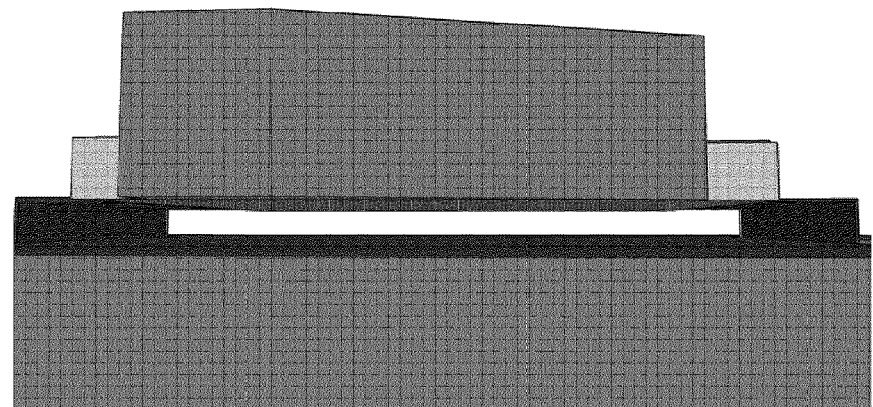
Figure 29F:
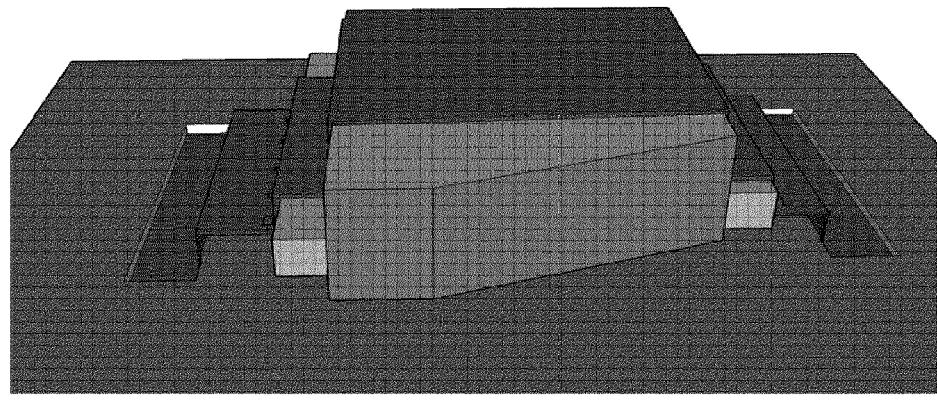

Next, in a step shown in FIG. 24, a silicon nitride layer 916 is deposited over the enter coupon wafer. In this example, it is around 500 nm thick, but the thickness can be varied in accordance to the requirements of the tethers. A resist 908 (e.g. photoresist) is then spun onto the device coupon, and patterned so as to define the eventual tethers and also apertures 910 forming a grating to expose the release layer. The silicon nitride 916 not covered by the resist 908 is then removed via an ashing process (e.g. a plasma ashing). The result of this is shown in FIG. 26, where the release layer 902 is now visible. The ashing process may undercut the silicon nitride underneath the resist by around 500 nm on the corners. However the resist has a length of at least 400 μm, and so structural integrity of the tether is retained. Next, the resist 908 is removed, and so the nitride tether 916 is ready. FIGS. 28A and 28B show two options for a subsequent processing step. In the step shown in FIG. 28A, a photoresist 912 is patterned to cover the entire device coupon 110. In an alternative, shown in FIG. 28B, only the facet is covered in a photoresist 914. The photoresist in FIG. 28B minimises the risk of causing failure of the tethers by only imparting a minimal amount of force to the device coupon.

FIGS. 29A-29F show various perspective views of a coupon wafer after a release layer has been removed. These views show how the tether 920 extends across an upper surface of the device coupon 110, down sidewall and across a ledge thereof, and then horizontally above the device substrate before descending into a trench of the substrate 922. Accordingly a gap 924 can be seen between the device coupon 110 and the substrate 922.

The features disclosed in the description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example+/−10%.

| List of Features | |
| --- | --- |
| 100 | Coupon wafer |
| 110 | Device coupon |
| 112 | Contact layer |
| 114 | P-doped indium phosphide layer |
| 116 | Quaternary active layer |
| 118 | N-doped indium phosphide layer |
| 120 | Release layer |
| 122 | Tether |
| 124 | Substrate |
| 126 | Gap |
| 200 | Coupon wafer |
| 220 | Release layer |
| 222 | Tether |
| 224 | Substrate |
| 226 | Gap |
| 228 | Channel |
| 300 | Coupon wafer |
| 302 | Photoresist |
| 326 | Gap |
| 400 | Coupon wafer |
| 404 | Photoresist |
| 500 | coupon wafer |
| 502 | Substrate |
| 504a-f | Tethers |
| 506 | Tapered region |
| 508 | Antireflective coating |
| 510 | Device coupon |
| 512 | P doped indium gallium arsenide layer |
| 514 | Release layer |
| 550 | Photoresist |
| 802 | Photoresist |
| 900 | Ledge |
| 902 | Release layer |
| 904 | Substrate |
| 906 | Antireflective coating |
| 908 | Photoresist |
| 910 | Aperture |
| 912 | Photoresist |
| 914 | Photoresist |
| 916 | Dielectric layer |
| 920 | Tether |
| 922 | Substrate |
| 924 | Gap |

The invention claimed is:

1. A coupon wafer comprising a device coupon for use in a micro-transfer printing process used to fabricate an opto-electronic device, wherein the coupon wafer includes a wafer substrate, and the device coupon is attached to the wafer substrate via a tether; and wherein the tether comprises a dielectric material, wherein the wafer substrate defines a raised platform, below the device coupon, and has a channel adjacent to the raised platform, wherein the tether comprises:

a first portion extending laterally along a top surface of the device coupon;

a second portion extending from the first portion and vertically along a side surface of the device coupon;

a third portion extending from the second portion and laterally away from a bottom of the device coupon;

a fourth portion extending from the third portion and vertically along a side surface of the raised platform; and a fifth portion extending from the fourth portion and laterally along a floor of the channel, wherein the tether is a multi-layered tether comprising at least one of a layer of silicon nitride or a layer of silicon oxide, wherein the tether has a thickness of at least 20 nm and no more than 500 nm, wherein the tether includes a plurality of apertures therethrough, and wherein a gap is defined directly between a top surface of the raised platform and the device coupon, and directly between the top surface of the raised platform and the third portion of the tether.

2. The coupon wafer of claim 1, wherein the tether includes: the layer of silicon nitride and a layer of photoresist; the layer of silicon oxide and a layer of photoresist; or the layer of silicon nitride, the layer of silicon oxide, and a layer of photoresist.

3. The coupon wafer of claim 1, wherein the device coupon includes an anti-reflective coating, and the tether is at least partially provided by the anti-reflective coating.

4. A method of preparing the coupon wafer of claim 1, wherein the method comprises:

depositing the tether across a surface of the device coupon to attach the device coupon to the wafer substrate.

5. A method of micro-transfer printing, using the coupon wafer of claim 1, comprising steps of:

adhering the device coupon to a stamp, and lifting it away from the coupon wafer; and depositing the device coupon on a platform wafer, thereby forming an optoelectronic device.

* * * * *